US012751294B2

(12) United States Patent
Yang et al.

(10) Patent No.: US 12,751,294 B2
(45) Date of Patent: Sep. 29, 2026

(54) LEAD FRAME WITH A TIE BAR HAVING BRANCH PART

(71) Applicant: Diodes Incorporated, Plano, TX (US)

(72) Inventors: Xiaorui Yang, Shanghai (CN); Wei Wu, Shanghai (CN)

(73) Assignee: DIODES INCORPORATED, Plano, TX (US)

( * ) Notice: Subject to any disclaimer, the term of this patent is extended or adjusted under 35 U.S.C. 154(b) by 630 days.

(21) Appl. No.: 18/193,596

(22) Filed: Mar. 30, 2023

(65) Prior Publication Data

US 2023/0238309 A1 Jul. 27, 2023

Related U.S. Application Data

(63) Continuation of application No. PCT/CN2021/133042, filed on Nov. 25, 2021.

(30) Foreign Application Priority Data

Apr. 29, 2021 (CN) ......................... 202110473462.5
Apr. 29, 2021 (CN) ......................... 202120920420.7

(51) Int. Cl.
*H10W 70/40* (2026.01)
*H10W 70/04* (2026.01)
(Continued)

(52) U.S. Cl.
CPC ....... *H10W 70/421* (2026.01); *H10W 70/041* (2026.01); *H10W 70/411* (2026.01);
(Continued)

(58) Field of Classification Search
CPC ........... H01L 23/49541; H01L 23/4952; H01L 23/3107; H01L 23/49551; H01L 23/49503; H01L 23/49575; H01L 21/4825; H01L 21/56; H01L 2924/181; H01L 24/46; H01L 24/49; H10W 70/465; H10W 70/041;
(Continued)

(56) References Cited

U.S. PATENT DOCUMENTS 6,225,683 B1 * 5/2001 Yalamanchili ...... H01L 23/4951 257/E23.047
2004/0238921 A1 12/2004 Lee et al.
(Continued)

FOREIGN PATENT DOCUMENTS

EP 3772097 A1 2/2021

*Primary Examiner* — Alonzo Chambliss
(74) *Attorney, Agent, or Firm* — Kilpatrick Townsend & Stockton LLP

(57) ABSTRACT

A semiconductor device and a lead frame. The semiconductor device comprises at least one semiconductor chip that is attached to a surface of a base island in a first plane, wherein a connecting rib is connected to the base island, and has a first part which is obliquely connected to the base island; the connecting rib has a second part, and the second part has a surface in a second plane; the second plane is parallel to the first plane and is a plane different from the first plane; the connecting rib has a branch part divided from the second part and the branch part has, in the second plane, a surface used for receiving a lead connected to the semiconductor chip; and the branch part has an edge which is distant from a first edge of the base island by a first distance.

15 Claims, 18 Drawing Sheets

(51) Int. Cl.
*H10W 74/01* (2026.01)
*H10W 74/10* (2026.01)
*H10W 90/00* (2026.01)

(52) U.S. Cl.
CPC ....... *H10W 70/427* (2026.01); *H10W 70/465* (2026.01); *H10W 74/01* (2026.01); *H10W 74/111* (2026.01); *H10W 90/756* (2026.01); *H10W 90/811* (2026.01)

(58) Field of Classification Search
CPC ... H10W 74/111; H10W 74/01; H10W 74/00; H10W 70/421; H10W 70/427; H10W 70/411; H10W 90/811; H10W 90/756
See application file for complete search history.

(56) References Cited

U.S. PATENT DOCUMENTS

| | | | |
|---|---|---|---|
| 2008/0128741 | A1 | 6/2008 | Li et al. |
| 2015/0014831 | A1 | 1/2015 | Chan et al. |

* cited by examiner

LEAD FRAME WITH A TIE BAR HAVING BRANCH PART

CROSS-REFERENCES TO RELATED APPLICATIONS

This application is a continuation of International Patent Application No. PCT/CN2021/133042, filed Nov. 25, 2021, published as WO2022/227537 on Nov. 3, 2022 and entitled "Semiconductor Device and Leading Frame," which claims priority to Chinese Patent Application No. 202110473462.5, filed on Apr. 29, 2021 and entitled "Semiconductor Device and Leading Frame," and priority to Chinese Patent Application No. 202120920420.7, filed on Apr. 29, 2021 and entitled "Semiconductor Device and Leading Frame," the entire contents of which are hereby incorporated by reference in their entirety.

TECHNICAL FIELD

The application relates to the field of semiconductor packaging, and particularly relates to a semiconductor device and a lead frame for constructing the semiconductor device.

A package product is generally obtained by attaching a chip to a lead frame, conductively connecting the chip to the lead frame by a bonding wire, and finally carrying out packaging with an encapsulating material.

Despite the progress made in the area of lead frames and semiconductor packaging, there is a need in the art for improved methods and systems related to lead frames and semiconductor packaging.

SUMMARY

An objective of the present application is to provide a lead frame and a semiconductor device using the lead frame. Through a branch part of the connecting rib, the quality problems caused when wire bonding is performed on the connecting rib are solved.

In order to achieve the above objective, according to an aspect of the present application, there is provided a semiconductor device, comprising at least one semiconductor chip which is attached to a surface of a base island in a first plane, wherein a connecting rib is connected to the base island, and has a first part which is obliquely connected to the base island; the connecting rib has a second part, and the second part has a surface in a second plane; the second plane is parallel to the first plane and is a plane different from the first plane; the connecting rib has a branch part divided from the second part and the branch part has, in the second plane, a surface used for receiving a lead connected to the semiconductor chip; and the branch part has an edge which is distant from a first edge of the base island by a first distance.

In some embodiments, the semiconductor device further comprises a plurality of lead fingers, each lead finger has a surface in the second plane, the surface of each lead finger is used for receiving a lead connected to the semiconductor chip, and each lead finger has an edge which is distant from the first edge of the base island by the first distance.

In some embodiments, the semiconductor chip has a top surface close to the second plane.

In some embodiments, the semiconductor device further comprises a lead connecting the semiconductor chip to the branch part of the connecting rib.

In some embodiments, the semiconductor device further comprises a lead connecting the semiconductor chip to the lead finger.

In some embodiments, the semiconductor device further comprises a second connecting rib connected to the base island at an opposite side of the base island.

In some embodiments, the second connecting rib has a branch part divided from the second connecting rib, the branch part has, in the second plane, a surface used for receiving a lead connected to the semiconductor chip, and the branch part of the second connecting rib has an edge which is distant from a second edge of the base island by a second distance.

In some embodiments, the semiconductor device further comprises a second connecting rib, a third connecting rib and a fourth connecting rib which are connected to the base island at four corners of the base island.

In some embodiments, the second connecting rib, the third connecting rib and the fourth connecting rib each have a branch part divided from the corresponding connecting rib, and the branch parts each have, in the second plane, a surface used for receiving a lead connected to the semiconductor chip.

In some embodiments, the semiconductor device further comprises a lead finger adjacent to the branch part, and the lead finger and the adjacent branch part have collinear edges facing an edge of the base island.

According to another aspect of the present application, there is provided a lead frame for a semiconductor device; the lead frame comprising: at least a base island which has, in a first plane, a surface used for receiving a semiconductor chip; a connecting rib which is connected to the base island and has a first part obliquely connected to the base island, the connecting rib having a second part, the second part having a surface in a second plane, and the second plane being parallel to the first plane and being a plane different from the first plane; and a plurality of lead fingers adjacent to the connecting rib; wherein the connecting rib has a branch part divided from the second part, the branch part has, in the second plane, a surface used for receiving a lead connected to the semiconductor chip, and the branch part is not directly connected to the adjacent lead finger.

In some embodiments, the branch part has an edge which is distant from a first edge of the base island by a first distance.

In some embodiments, each lead finger has a surface in the second plane, the surface of each lead finger is used for receiving a lead connected to the semiconductor chip, and each lead finger has an edge which is distant from the first edge of the base island by the first distance.

In some embodiments, the semiconductor chip has a top surface close to the second plane.

In some embodiments, the semiconductor device further comprises a second connecting rib connected to the base island at an opposite side of the base island.

In some embodiments, the second connecting rib has a branch part divided from the second connecting rib, the branch part has, in the second plane, a surface used for receiving a lead connected to the semiconductor chip, and the branch part of the second connecting rib is not directly connected to the adjacent lead finger.

In some embodiments, the branch part of the second connecting rib has an edge which is distant from a second edge of the base island by a second distance.

In some embodiments, the semiconductor device further comprises a second connecting rib, a third connecting rib and a fourth connecting rib which are connected to the base island at four corners of the base island.

In some embodiments, the second connecting rib, the third connecting rib and the fourth connecting rib each have a branch part divided from the corresponding connecting rib, the branch parts each have, in the second plane, a surface used for receiving a lead connected to the semiconductor chip, and the branch part of the second connecting rib, the branch part of the third connecting rib and the branch part of the fourth connecting rib are each not directly connected to the adjacent lead finger.

In some embodiments, the branch part of the second connecting rib, the branch part of the third connecting rib and the branch part of the fourth connecting rib respectively have an edge which is distant from a second edge of the base island by a second distance.

In some embodiments, the lead finger and the adjacent branch part have collinear edges facing an edge of the base island.

According to another aspect of the present application, there is provided a method for forming a semiconductor package; the method comprising: providing a lead frame, the lead frame which includes: at least one base island which has, in a first plane, a surface used for receiving a semiconductor chip; a connecting rib which is connected to the base island and has a first part obliquely connected to the base island, the connecting rib having a second part, the second part having a surface in a second plane, and the second plane being parallel to the first plane and being a plane different from the first plane; and a plurality of lead fingers adjacent to the connecting rib. The connecting rib has a branch part divided from the second part, the branch part has, in the second plane, a surface used for receiving a lead connected to the semiconductor chip, and the branch part is not directly connected to the adjacent lead finger. The method also includes attaching a semiconductor chip to the base island of the lead frame; forming wire bonds between pads on the semiconductor chip and the lead fingers; and forming an encapsulating material over the semiconductor chip and the lead frame.

In some embodiments, each lead finger has a surface in the second plane, the surface of each lead finger is used for receiving a lead connected to the semiconductor chip, and each lead finger has an edge which is distant from the first edge of the base island by the first distance.

In some embodiments, the semiconductor device further comprises a second connecting rib connected to the base island at an opposite side of the base island.

In some embodiments, the second connecting rib has a branch part divided from the second connecting rib, the branch part has, in the second plane, a surface used for receiving a lead connected to the semiconductor chip, and the branch part of the second connecting rib is not directly connected to the adjacent lead finger.

In the present application, the branch part is divided from the second part of the connecting rib (and/or the second connecting rib, the third connecting rib and the fourth connecting rib) so as to distinguish an area for lead bonding in the connecting rib (and/or the second connecting rib, the third connecting rib and the fourth connecting rib), and the other second parts, as well as the first part obliquely connected to the base island, of the connecting rib(and/or the second connecting rib, the third connecting rib and the fourth connecting rib) mainly play a role of connection to the base island as played by conventional connecting ribs. Therefore, in a lead bonding process, when a lead finger is flattened by rolling before being subjected to regular wire bonding, since the surface of the second part of the connecting rib (and/or the second connecting rib, the third connecting rib and the fourth connecting rib), the surface of the branch part and the surface of the lead finger are all in a same plane (second plane), the second part and the branch part of the connecting rib (and/or the second connecting rib, the third connecting rib and the fourth connecting rib) are also flattened by rolling to have a surface quality allowing lead bonding. Thus, quality problems caused in an existing semiconductor device and a lead frame comprised therein by indentations and/or unevenness and the like of connecting ribs when leads are welded on the connecting ribs are solved.

Further, since the surface of the second part of the connecting rib (and/or the second connecting rib, the third connecting rib and the fourth connecting rib) and the surfaces of the other lead fingers are located in a same plane, it is also avoided that the solder joint position of the lead is low, thereby solving the problem that the wire radian and the wire length are not ideal and the problem of wire off due to the easy delamination of the base island surface and an encapsulating material.

DETAILED DESCRIPTION OF THE EMBODIMENTS

The techniques of the present application are described in detail below with reference to specific embodiments. It is to be appreciated that the following specific embodiments are only for helping those skilled in the art to understand the present application, and are not limitations of the present application.

In a bonding diagram design, it is often encountered that there are not enough positions of ground wires, resulting in a need for additional silver-plated areas on a base island. Alternatively, the positions of bonding wires will be awkward, and if bonding wires are not welded on connecting ribs, problems such as crossed bonding wires and ultra-long bonding wires and the like will occur, making it impossible to perform bonding work, so that in an actual process, wire bonding has to be performed on the connecting rib.

However, generally, in frame fabrication, connecting ribs will have problems such as indentation and unevenness and the like, so that a quality problem will be caused when wire bonding on the connecting ribs occurs.

In addition, it is known to those skilled in the art that a part of a connecting rib connected to a base island requires a corresponding downward punching treatment. Therefore, when wire bonding has to be performed on a connecting rib, in addition to the problems such as indentation and unevenness and the like on the surface of the connecting rib, a situation that a bonding wire must be welded on the downward punched part of the connecting rib also will occur. In this case, since the solder joint position of the bonding wire is extremely low, it is easy to cause both the wire radian and the wire length to be not ideal, and since a base island is a position where delamination is most likely to occur in a package body, a problem of wire off due to the delamination of the base island surface and an encapsulating material is easily caused.

Figure 1A:
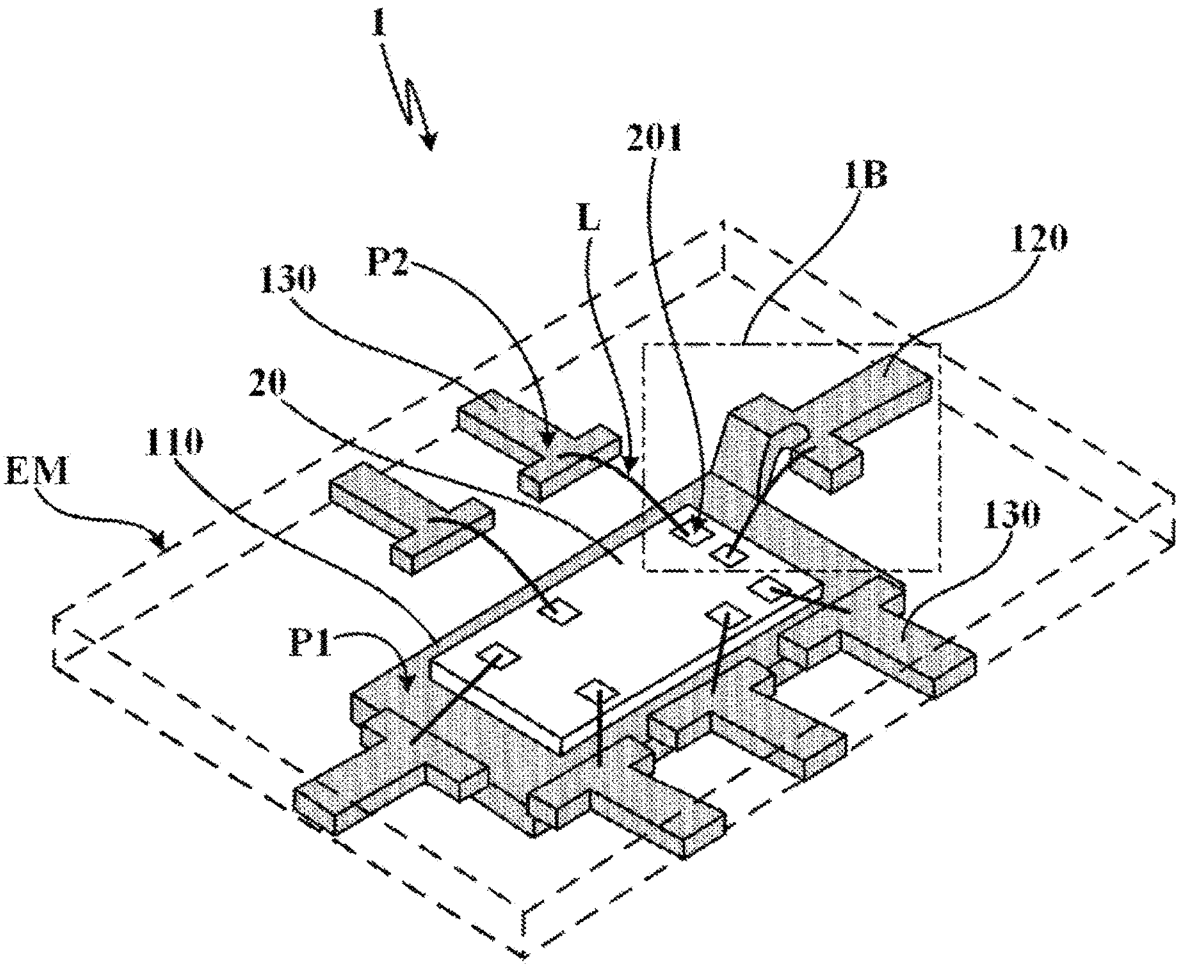
FIG. 1A is a schematic structural diagram of a semiconductor device 1 according to an embodiment of the present application.

In this embodiment, a semiconductor device 1 is provided. As shown in FIG. 1A, the semiconductor device 1 includes a semiconductor chip 20, and an encapsulating material EM for plastic encapsulating the semiconductor chip 20 to form the device. As shown in FIG. 1A, the semiconductor device 1 is provided with a base island 110, a connecting rib 120 connected to the base island 110 and a plurality of lead fingers 130 disposed around the base island 110. The chip 20 has a plurality of pads 201, and each pad 201 is electrically connected to a lead finger 130 by a lead L.

A plane at which a surface of the base island 110 for attaching the semiconductor chip 20 thereto (i.e., an upper surface of the base island 110 in FIG. 1A) is located is defined as a first plane P1. And a plane at which a surface of the lead finger 130 for receiving the lead L (i.e., an upper surface of the lead finger 130 described in FIG. 1A) is located is defined as a second plane P2, that is, a surface of each lead finger 130 for receiving the lead L is located in the second plane P2. As shown in FIG. 1A, the second plane P2 is parallel to the first plane P1, and the second plane P2 is a plane different from the first plane P1.

The structure of the connecting rib 120 is described in detail below with reference to FIGS. 1B and 1C.

Figure 1B:
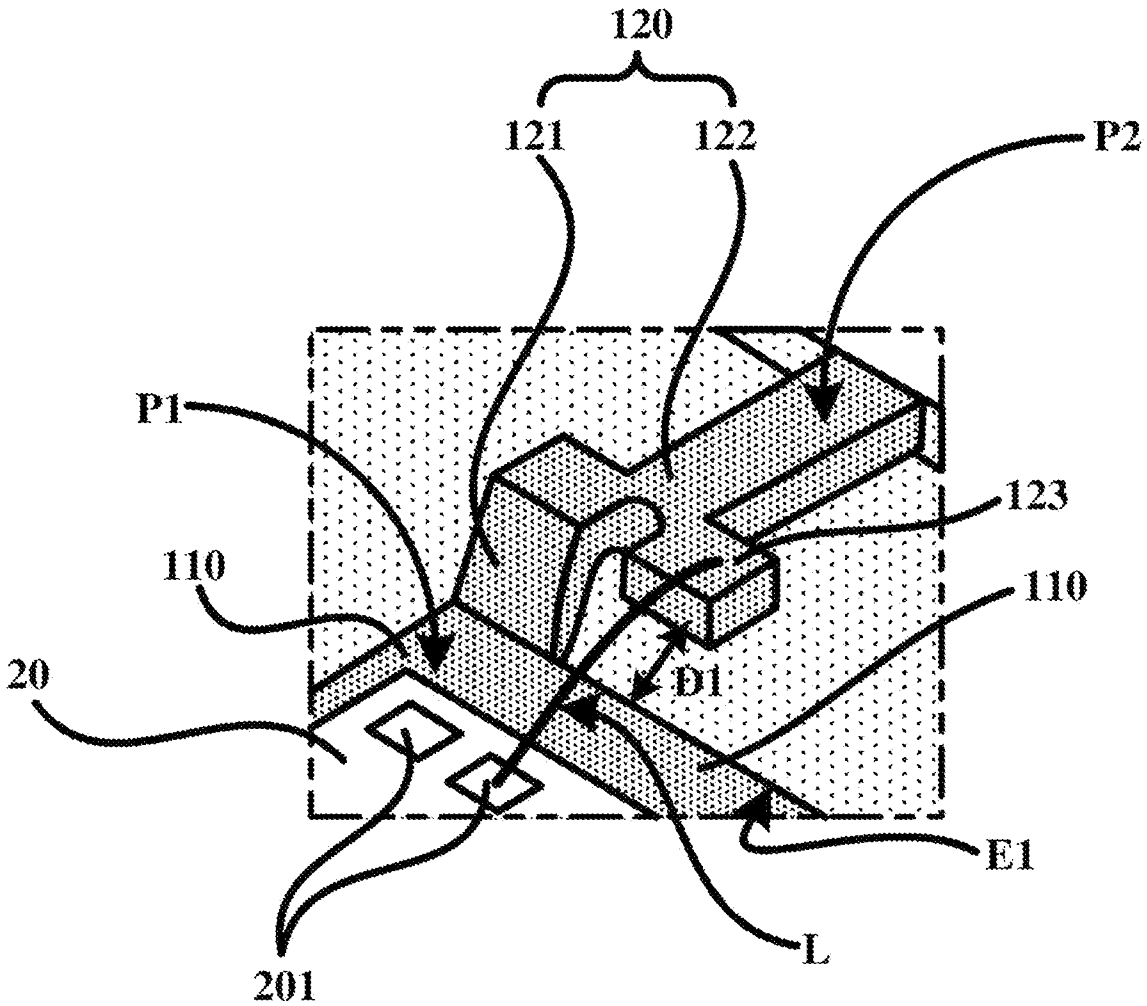
FIG. 1B is an enlarged partial view of an area 1B in FIG. 1A.
Figure 1C:
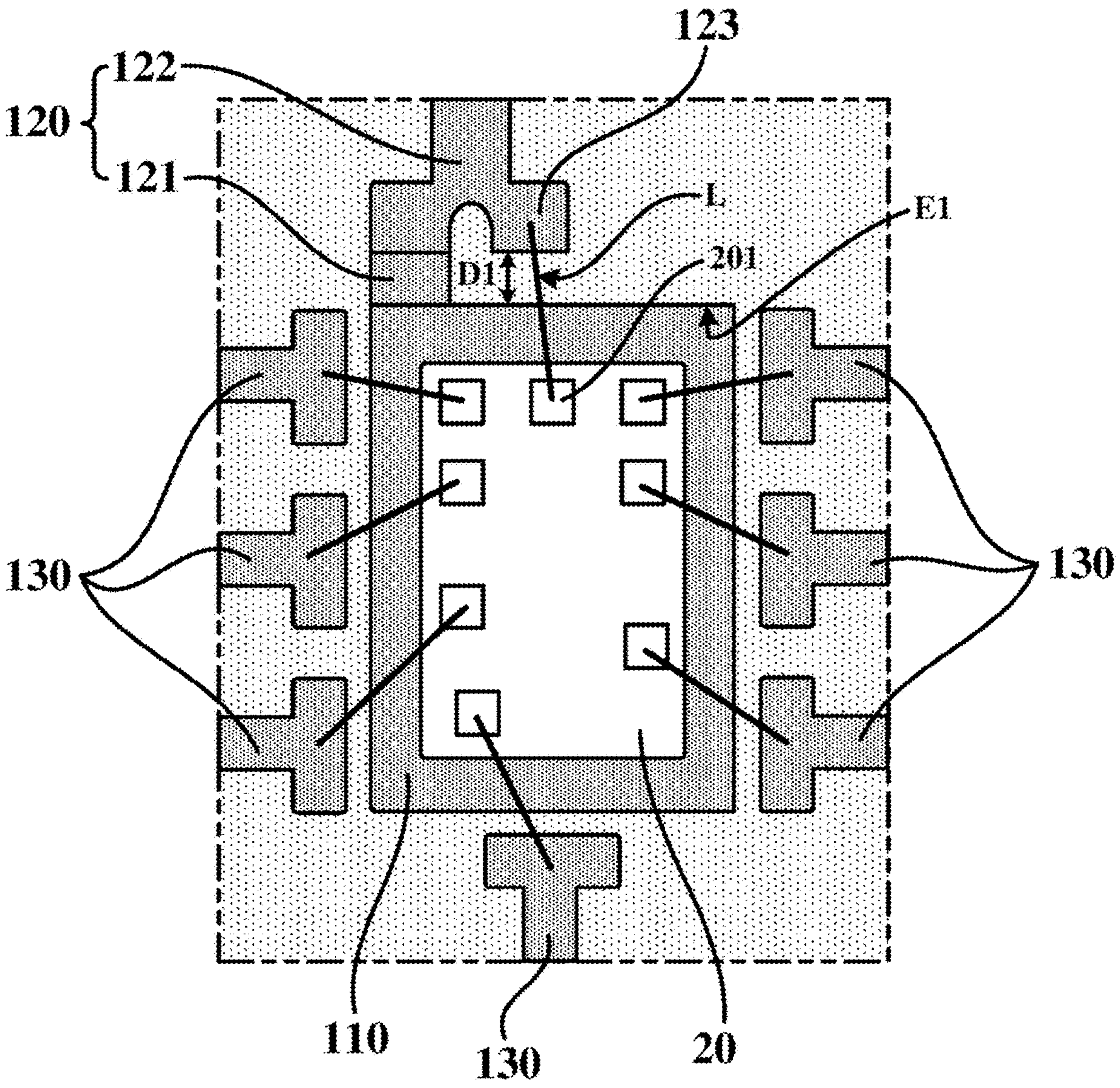
FIG. 1C is a top view of a semiconductor chip, a base island, a connecting rib, a lead finger, and a lead integrated into the semiconductor device 1 shown in FIG. 1A.

As shown in FIGS. 1B and 1C, the connecting rib 120 has a first part 121 and a second part 122, where the first part 121 is a part of the connecting rib 120 that is obliquely connected to the base island 110, and a surface of the second part 122 (i.e., an upper surface of the second part 122 in FIG. 1B) is located in the second plane P2.

As shown in FIGS. 1B and 1C, a branch part 123 is divided from the second part 122 and used for receiving a lead L connected to the pad 201 of the chip 20. In particular, the lead L is connected to a surface of the branch part 123 (i.e., an upper surface of the branch part 123 in FIG. 1B), and the surface is located in the second plane P2 as shown in FIG. 1B. Moreover, an edge of the branch part 123 is distant from a first edge E1 of the base island 110 by a first distance D1, as shown in FIG. 1C.

Thus, as shown in FIGS. 1A-1C, in this embodiment, the branch part 123 is divided from the second part 122 of the connecting rib 120 so as to distinguish an area for receiving the lead in the connecting rib 120, and the other second parts 122, as well as the first part 121 obliquely connected to the base island 110, of the connecting rib 120 mainly play a role of connection to the base island in the semiconductor device as played by conventional connecting ribs.

Based on the structure of the semiconductor device 1 of the present application described above, those skilled in the art can specifically set the positions of the lead finger and the connecting rib according to actual needs. Several semiconductor devices contained in the scope of the present application will be listed below, and it will be appreciated by those skilled in the art that the semiconductor devices and the lead frames used for constructing the semiconductor devices shown in FIGS. 2A-8C described below are only for better illustration of the present application rather than for limitation.

Figure 2A:
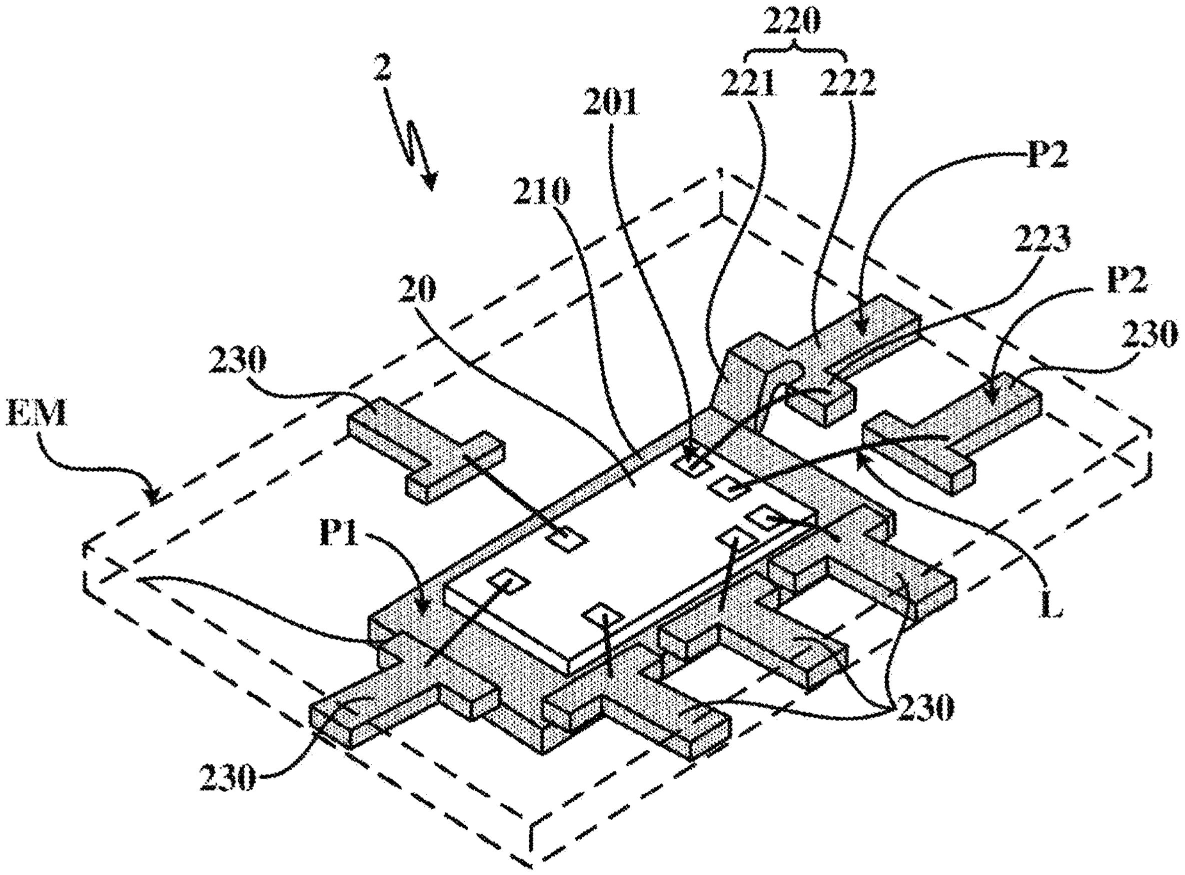
FIG. 2A is a schematic structural diagram of a semiconductor device 2 according to another embodiment of the present application.
Figure 2B:
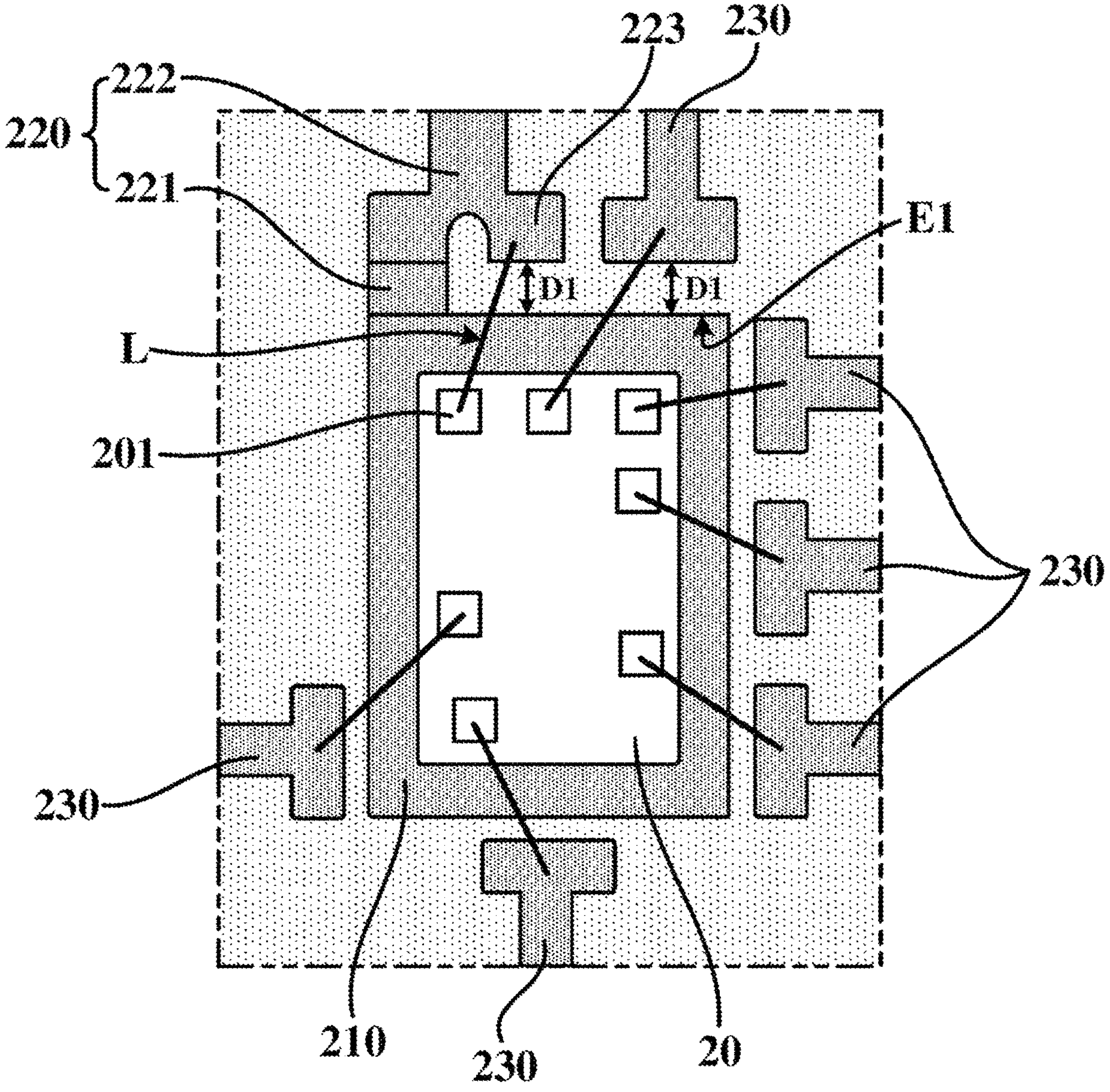
FIG. 2B is a top view of a semiconductor chip, a base island, a connecting rib, a lead finger, and a lead integrated into the semiconductor device 2 shown in FIG. 2A.

FIGS. 2A and 2B show a semiconductor device 2 constructed according to another embodiment of the present application.

As shown in FIG. 2A, the general structure of the semiconductor device 2 in this embodiment is similar to that of the semiconductor device 1 shown in FIG. 1A. The semiconductor device 2 includes a semiconductor chip 20, and an encapsulating material EM for plastic encapsulating the semiconductor chip 20 to form the device. As shown in FIG. 2A, the semiconductor device 2 is provided with a base island 210, a connecting rib 220 connected to the base island 210 and a plurality of lead fingers 230 disposed around the base island 210. The chip 20 has a plurality of pads 201, and each pad 201 is electrically connected to a lead finger 230 by a lead L.

Similar to the connecting rib 120 in the semiconductor device 1 shown in FIGS. 1A-1C, as shown in FIGS. 2A and 2B, the connecting rib 220 has a first part 221 and a second part 222; where the first part 221 is a part of the connecting rib 220 that is obliquely connected to the base island 210, and a surface of the second part 222 (i.e., an upper surface of the second part 222 in FIG. 2A) is located in the second plane P2.

Similar to the connecting rib 120 in the semiconductor device 1 shown in FIGS. 1A-1C, as shown in FIGS. 2A and 2B, a branch part 223 is divided from the second part 222 of the connecting rib 220 and used for receiving a lead L connected to the pad 201 of the chip 20. In particular, the lead L is connected to a surface of the branch part 223 (i.e., an upper surface of the branch part 123 in FIG. 2A), and the surface is located in the second plane P2 as shown in FIG. 2A. Moreover, as shown in FIG. 2B, an edge of the branch part 223 is distant from a first edge E1 of the base island 210 by a first distance D1.

Unlike the semiconductor device 1 shown in FIGS. 1A-1C, in the semiconductor device 2 in this embodiment, a lead finger 230 is disposed adjacent to the connecting rib 220, as shown in FIGS. 2A and 2B. In particular, as shown in FIG. 2B, the lead finger 230 adjacent to the connecting rib 220 is not directly connected to the branch part 223 of the adjacent connecting rib 220, and an edge of the lead finger 230 is distant from the first edge E1 of the base island 210 by the first distance D1.

Figure 3A:
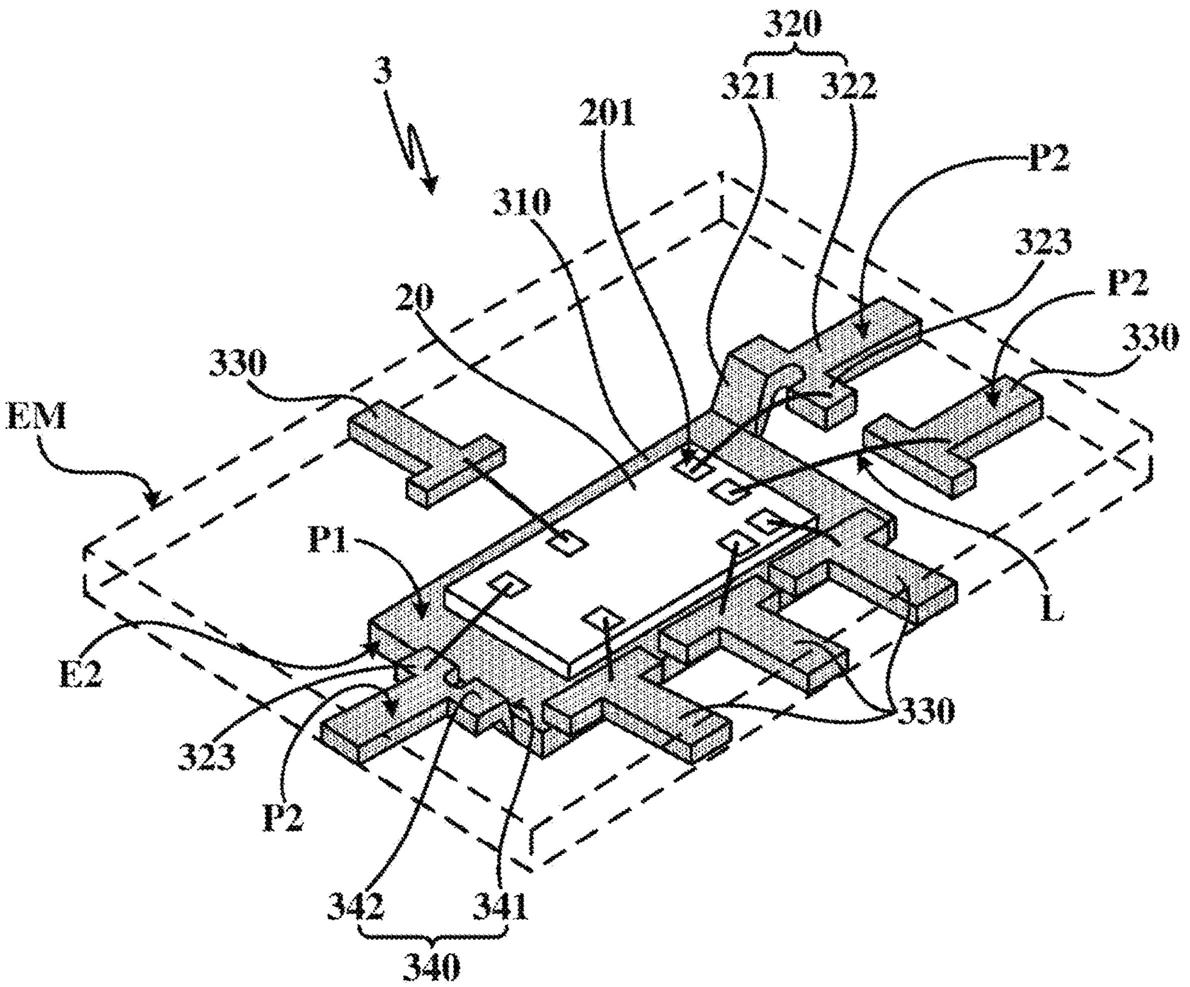
FIG. 3A is a schematic structural diagram of a semiconductor device 3 according to a further embodiment of the present application.
Figure 3B:
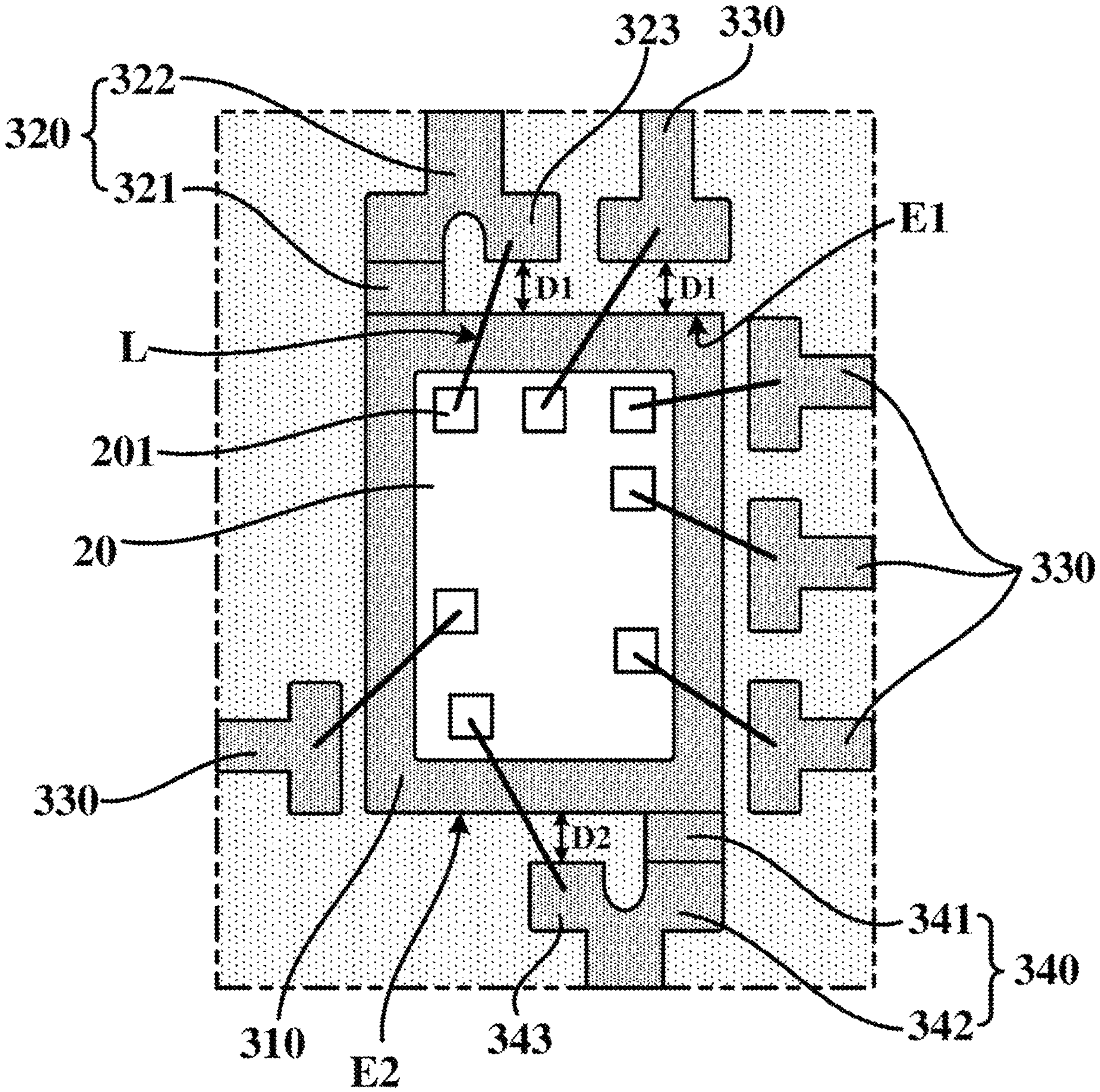
FIG. 3B is a top view of a semiconductor chip, a base island, a connecting rib, a second connecting rib, a lead finger, and a lead integrated into the semiconductor device 3 shown in FIG. 3A.

FIGS. 3A and 3B show a semiconductor device 3 constructed according to another embodiment of the present application.

As shown in FIG. 3A, the general structure of the semiconductor device 3 in this embodiment is similar to that of the semiconductor device 2 shown in FIG. 2A. The semiconductor device 3 includes a semiconductor chip 20, and an encapsulating material EM for plastic encapsulating the semiconductor chip 20 to form the device. As shown in FIG. 3A, the semiconductor device 3 is provided with a base island 310, a connecting rib 320 connected to the base island 310 and a plurality of lead fingers 330 disposed around the base island 310 and adjacent to the connecting rib 320. The chip 20 has a plurality of pads 201, and each pad 201 is electrically connected to a lead finger 330 by a lead L.

Similar to the connecting rib 220 in the semiconductor device 2 shown in FIGS. 2A and 2B, as shown in FIGS. 3A and 3B, a branch part 323 is divided from a second part 322 of the connecting rib 320 and used for receiving a lead L connected to the pad 201 of the chip 20. In particular, the lead L is connected to a surface of the branch part 323 (i.e., an upper surface of the branch part 323 in FIG. 3A), and the surface is located in the second plane P2 as shown in FIG. 3A. Moreover, as shown in FIG. 3B, an edge of the branch part 323 is distant from a first edge E1 of the base island 310 by a first distance D1.

Unlike the semiconductor device 2 shown in FIGS. 2A and 2B, the semiconductor device 3 in this embodiment is provided with a second connecting rib 340, particularly provided with the second connecting rib 340 at a second edge E2 opposite to the first edge E1 of the base island 310, as shown in FIGS. 3A and 3B.

The structure of the second connecting rib 340 is preferably the same as that of the connecting rib 320. In particular, as shown in FIGS. 3A and 3B, the second connecting rib 340 also has a first part 341 obliquely connected to the base island 310, a second part 342 having a surface located in the second plane P2, and a branch part 343 divided from the second part. Moreover, as shown in FIG. 3B, the branch part 342 of the second connecting rib 340 is distant from a second edge E2 of the base island 310 by a second distance D2. The second distance D2 is equal to the first distance D1, and may also be set specifically according to actual process requirements. As shown in FIGS. 3A and 3B, the branch part 343 of the second connecting rib 340 is also used for receiving a lead.

Figure 4A:
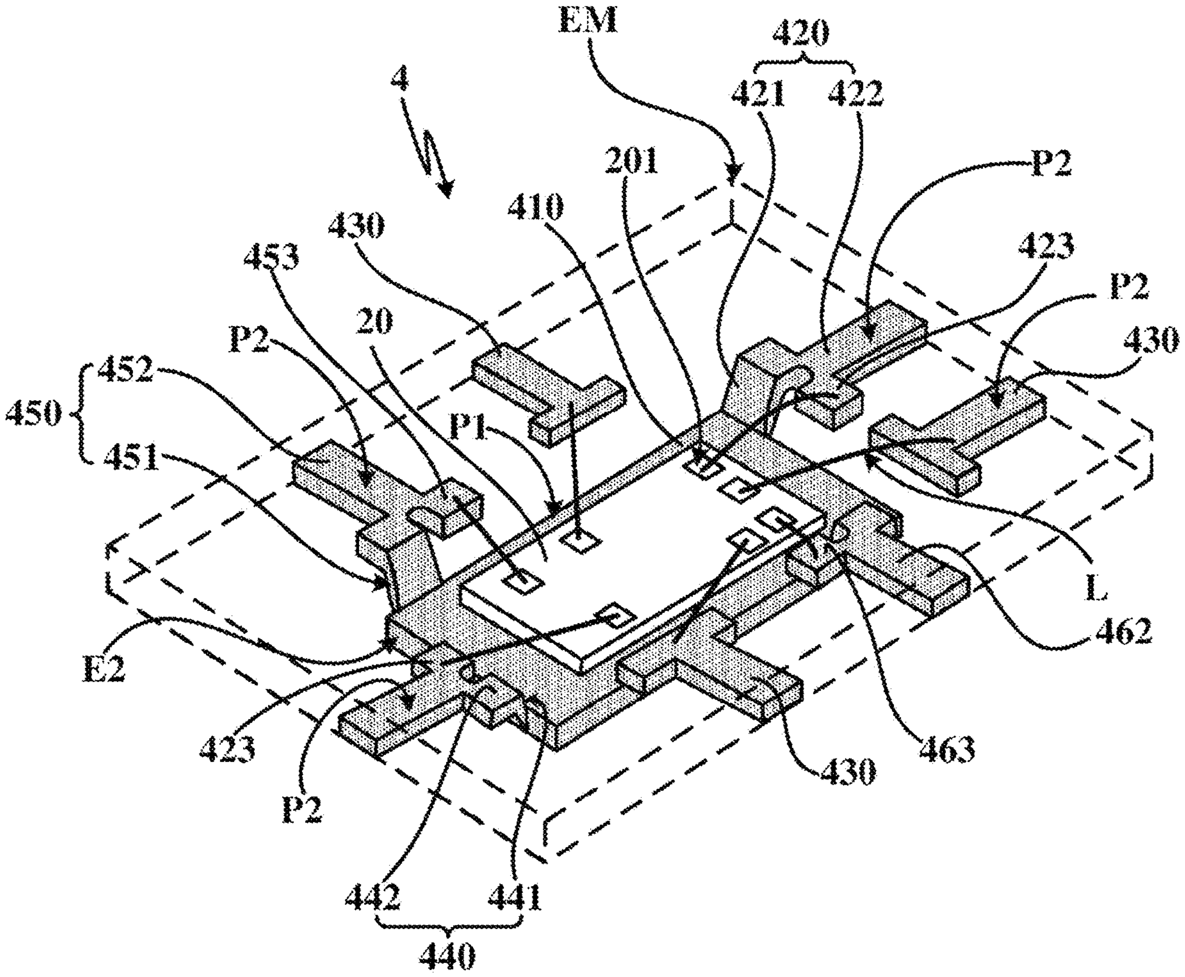
FIG. 4A is a schematic structural diagram of a semiconductor device 4 according to still a further embodiment of the present application.
Figure 4B:
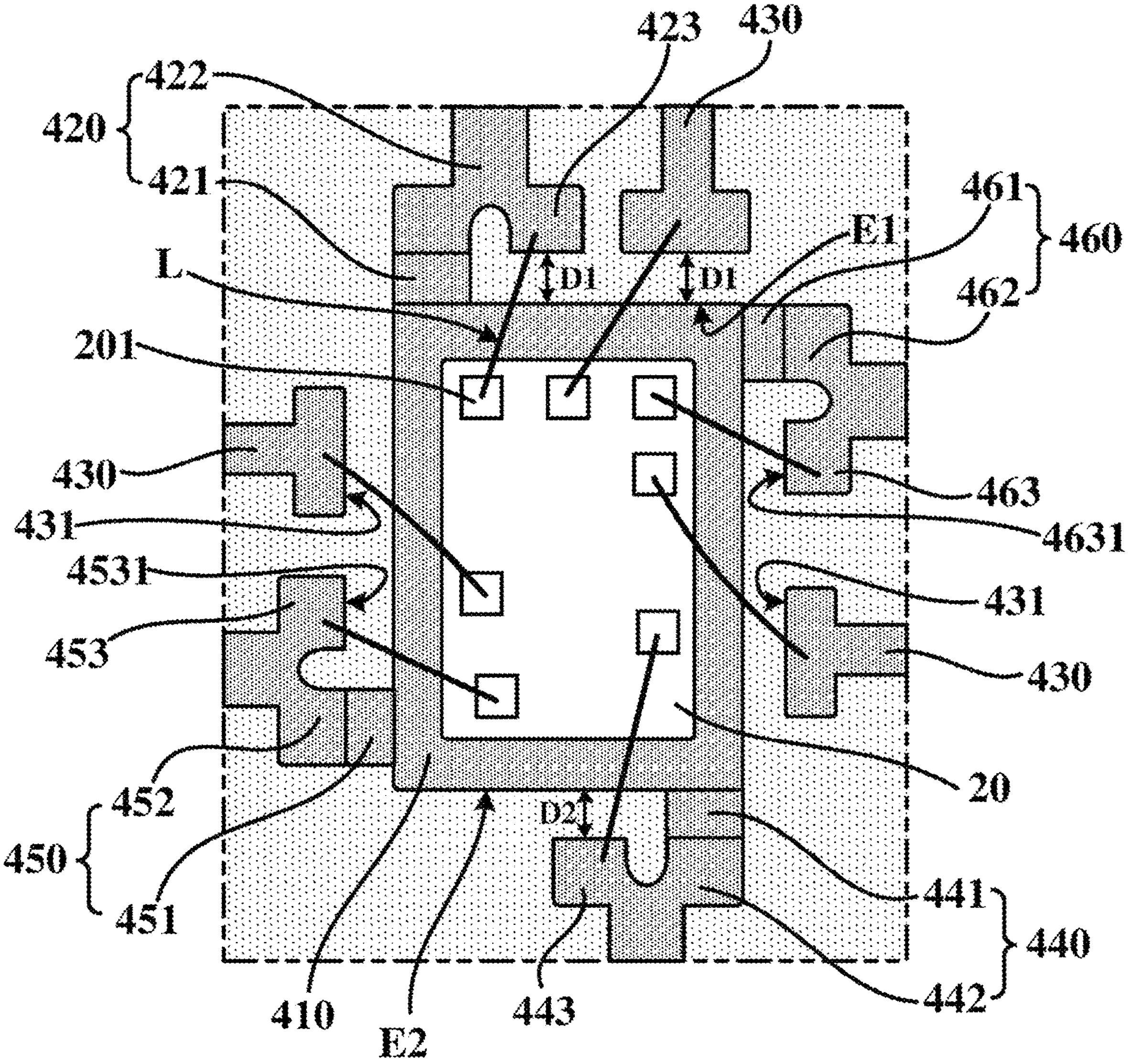
FIG. 4B is a top view of a semiconductor chip, a base island, a connecting rib, a second connecting rib, a third connecting rib, a fourth connecting rib, a lead finger, and a lead integrated into the semiconductor device 4 shown in FIG. 4A.

FIGS. 4A and 4B show a semiconductor device 4 constructed according to another embodiment of the present application.

As shown in FIG. 4A, the general structure of the semiconductor device 4 in this embodiment is similar to that of the semiconductor device 3 shown in FIG. 3A. The semiconductor device 4 includes a semiconductor chip 20, and an encapsulating material EM for plastic encapsulating the semiconductor chip 20 to form the device. As shown in FIG. 4A, the semiconductor device 4 is provided with a base island 410, a connecting rib 420 connected to the base island 410 and a plurality of lead fingers 330 disposed around the base island 410 and adjacent to the connecting rib 420. The chip 20 has a plurality of pads 201, and each pad 201 is electrically connected to a lead finger 430 by a lead L.

Similar to the connecting rib 320 in the semiconductor device 3 shown in FIGS. 3A and 3B, as shown in FIGS. 4A and 4B, a branch part 423 is divided from a second part 422 of the connecting rib 420 and used for receiving a lead L connected to the pad 201 of the chip 20. In particular, the lead L is connected to a surface of the branch part 423 (i.e., an upper surface of the branch part 423 in FIG. 4A), and the surface is located in the second plane P2 as shown in FIG. 4A. Moreover, as shown in FIG. 4B, an edge of the branch part 423 is distant from a first edge E1 of the base island 410 by a first distance D1.

Similar to the semiconductor device 3 shown in FIGS. 3A and 3B, as shown in FIGS. 4A and 4B, the semiconductor device 4 in this embodiment is provided with a second connecting rib 440 at a second edge E2 opposite to the first edge E1 of the base island 410. In particular, as shown in FIGS. 4A and 4B, the second connecting rib 440 also has a first part 441 obliquely connected to the base island 410, a second part 442 having a surface located in the second plane P2, and a branch part 443 divided from the second part. Moreover, as shown in FIG. 4B, the branch part 442 of the second connecting rib 440 is distant from the second edge E2 of the base island 410 by a second distance D2. The second distance D2 is equal to the first distance D1, and may also be set specifically according to actual process requirements. As shown in FIGS. 4A and 4B, the branch part 443 of the second connecting rib 440 is also used for receiving a lead.

Unlike the semiconductor device 3 shown in FIGS. 3A and 3B, a third connecting rib 450 and a fourth connecting rib 460 are provided in the semiconductor device 4 in this embodiment, the third connecting rib 450 and the fourth connecting rib 460 are respectively disposed at a side edge of the base island 410, and the structures of the third connecting rib 450 and the fourth connecting rib 460 are similar to that of the second connecting rib 440. In particular, as shown in FIGS. 4A and 4B, the third connecting rib 450 has a first part 451 obliquely connected to the base island 410, a second part 452 having a surface located in the second plane P2, and a branch part 453 divided from the second part; and the fourth connecting rib 460 has a first part 461 obliquely connected to the base island 410, a second part 462 having a surface located in the second plane P2, and a branch part 463 divided from the second part. As shown in FIG. 4A, surfaces of the branch part 453 of the third connecting rib 450 and the branch part 463 of the fourth connecting rib 460 located in the second plane P2 are used for receiving the leads.

Moreover, as shown in FIG. 4B, the third connecting rib 450 and the fourth connecting rib 460 are respectively provided with a lead finger 430 adjacent thereto. The branch part 453 of the third connecting rib 450 and the branch part 463 of the fourth connecting rib 460 are not directly connected to the adjacent lead fingers 430 respectively. Particularly preferably, as shown in FIG. 4B, an edge 4531, facing the base island 410, of the branch part 453 of the third connecting rib 450 and an edge 431 of the adjacent lead finger 430 are collinear. Similarly, an edge 4631, facing the base island 410, of the branch part 463 of the four connecting rib 460 and an edge 431 of the adjacent lead finger 430 are collinear.

Figure 4C:
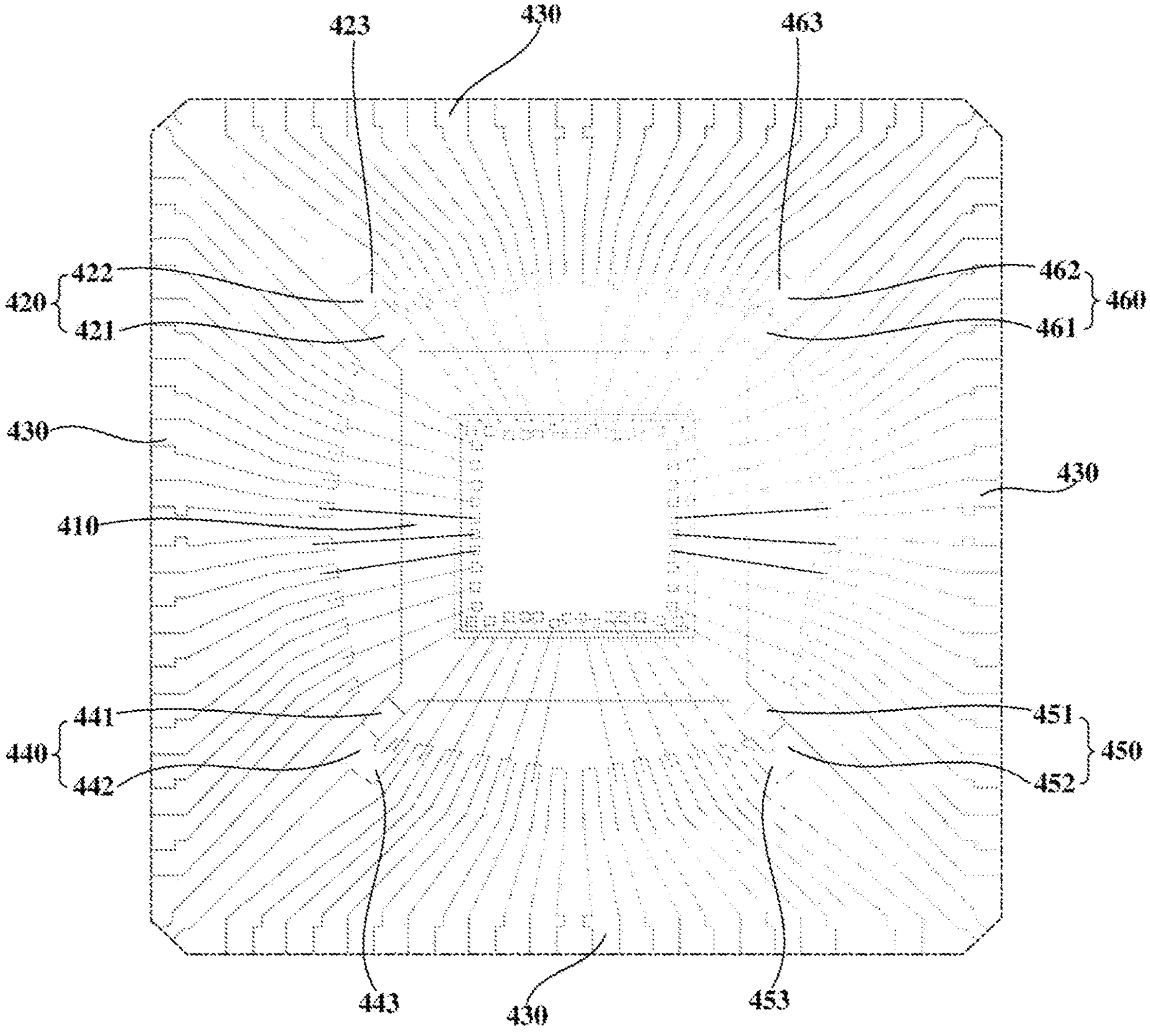
FIG. 4C is a top view showing different arrangement positions of the connecting rib, the second connecting rib, the third connecting rib and the fourth connecting rib in the semiconductor device 4 shown in FIG. 4A.

FIG. 4C shows different arrangement positions of the connecting rib 420, the second connecting rib 440, the third connecting rib 450 and the fourth connecting rib 460 in the semiconductor device 4 in this embodiment. As shown in FIG. 4C, in the semiconductor device 4 in this embodiment, the connecting rib 420, the second connecting rib 440, the third connecting rib 450 and the fourth connecting rib 460 may be disposed at four corners of the base island 410 respectively. That is, as shown in FIG. 4C, as an alternative embodiment, the first part 421 of the connecting rib 420, the first part 441 of the second connecting rib 440, the first part 451 of the third connecting rib 450 and the first part 461 of the fourth connecting rib 460 may be obliquely connected to the four corners of the base island 410, respectively. Meanwhile, the branch part 423 of the connecting rib 420, the branch part 453 of the third connecting rib 450 and the branch part 463 of the fourth connecting rib 460 are not directly connected to the adjacent lead fingers 430, respectively. Moreover, as shown in FIG. 4C, similar to the structure shown in FIG. 4B, the edges, facing the base island 410, of the branch part 443 of the second connecting rib 440, the branch part 453 of the third connecting rib 450 and the fourth connecting rib 463 are also respectively collinear with the edges of the adjacent lead fingers 430.

Figure 5A:
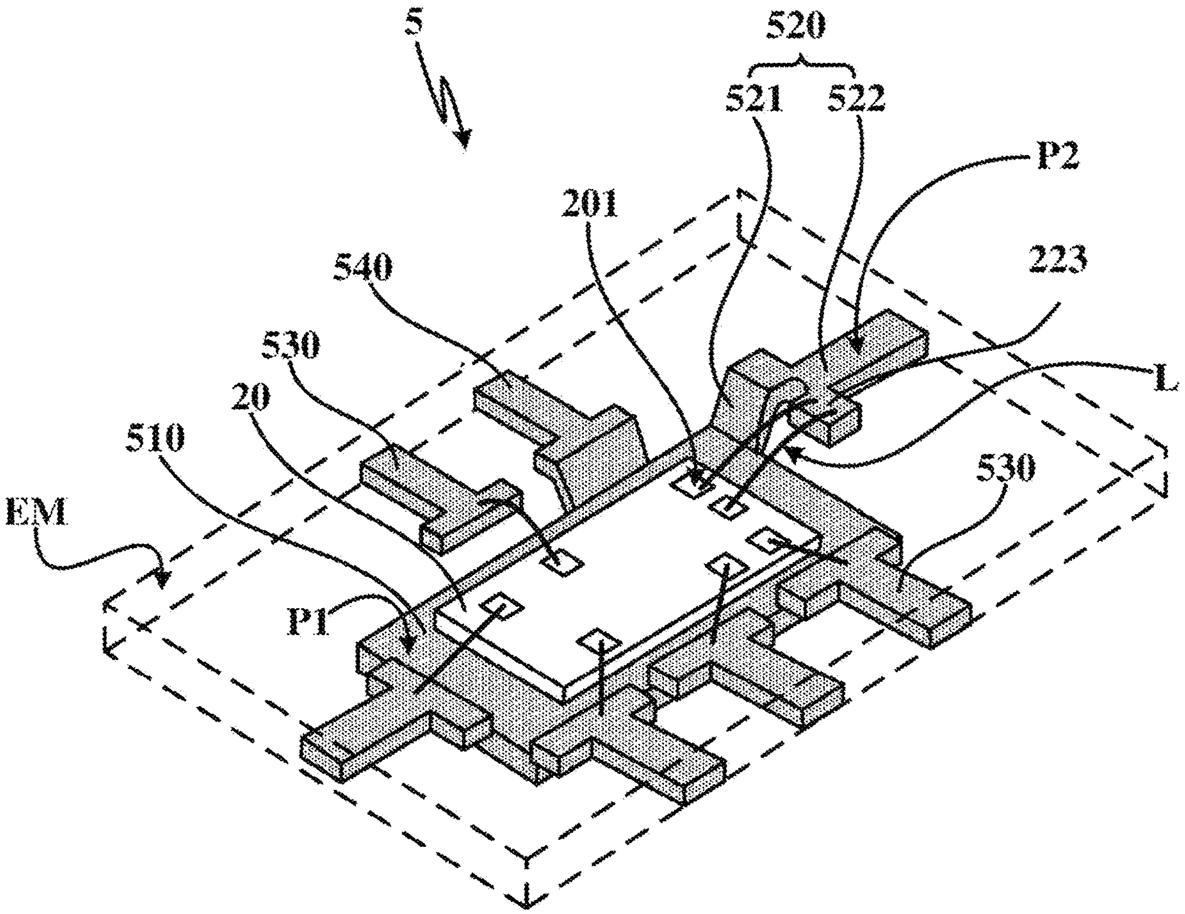
FIG. 5A is a schematic structural diagram of a semiconductor device 5 according to still a further embodiment of the present application.

FIG. 5A shows a semiconductor device 5 constructed according to another embodiment of the present application.

As shown in FIG. 5A, the general structure of the semiconductor device 5 in this embodiment is similar to that of the semiconductor device 1 shown in FIG. 1A. The semiconductor device 5 includes a semiconductor chip 20, and an encapsulating material EM for plastic encapsulating the semiconductor chip 20 to form the device. As shown in FIG. 5A, the semiconductor device 5 is provided with a base island 510, a connecting rib 520 connected to the base island 510 and a plurality of lead fingers 530 disposed around the base island 510. The chip 20 has a plurality of pads 201, and each pad 201 is electrically connected to a lead finger 530 by a lead L.

Similar to the connecting rib 120 in the semiconductor device 1 shown in FIGS. 1A-1C, as shown in FIG. 5A, the connecting rib 520 has a first part 521 and a second part 222; where the first part 521 is a part of the connecting rib 520 that is obliquely connected to the base island 510, and a surface of the second part 522 (i.e., an upper surface of the second part 522 in FIG. 5A) is located in the second plane P2.

Similar to the connecting rib 120 in the semiconductor device 1 shown in FIGS. 1A-1C, as shown in FIG. 5A, a branch part 523 is divided from the second part 522 of the connecting rib 520 and used for receiving a lead L connected to the pad 201 of the chip 20. In particular, the lead L is connected to a surface of the branch part 523 (i.e., an upper surface of the branch part 523 in FIG. 5A), and the surface is located in the second plane P2 as shown in FIG. 5A.

Unlike the semiconductor device 1 shown in FIGS. 1A-1C, a second connecting rib 540 is provided in the semiconductor device 5 in this embodiment, and the second connecting rib 540 is connected to the base island 510, as shown in FIG. 5A. Unlike the connecting rib 520, the second connecting rib 540 is only for being connected to the base island 510 rather than for receiving a lead.

Figure 5B:
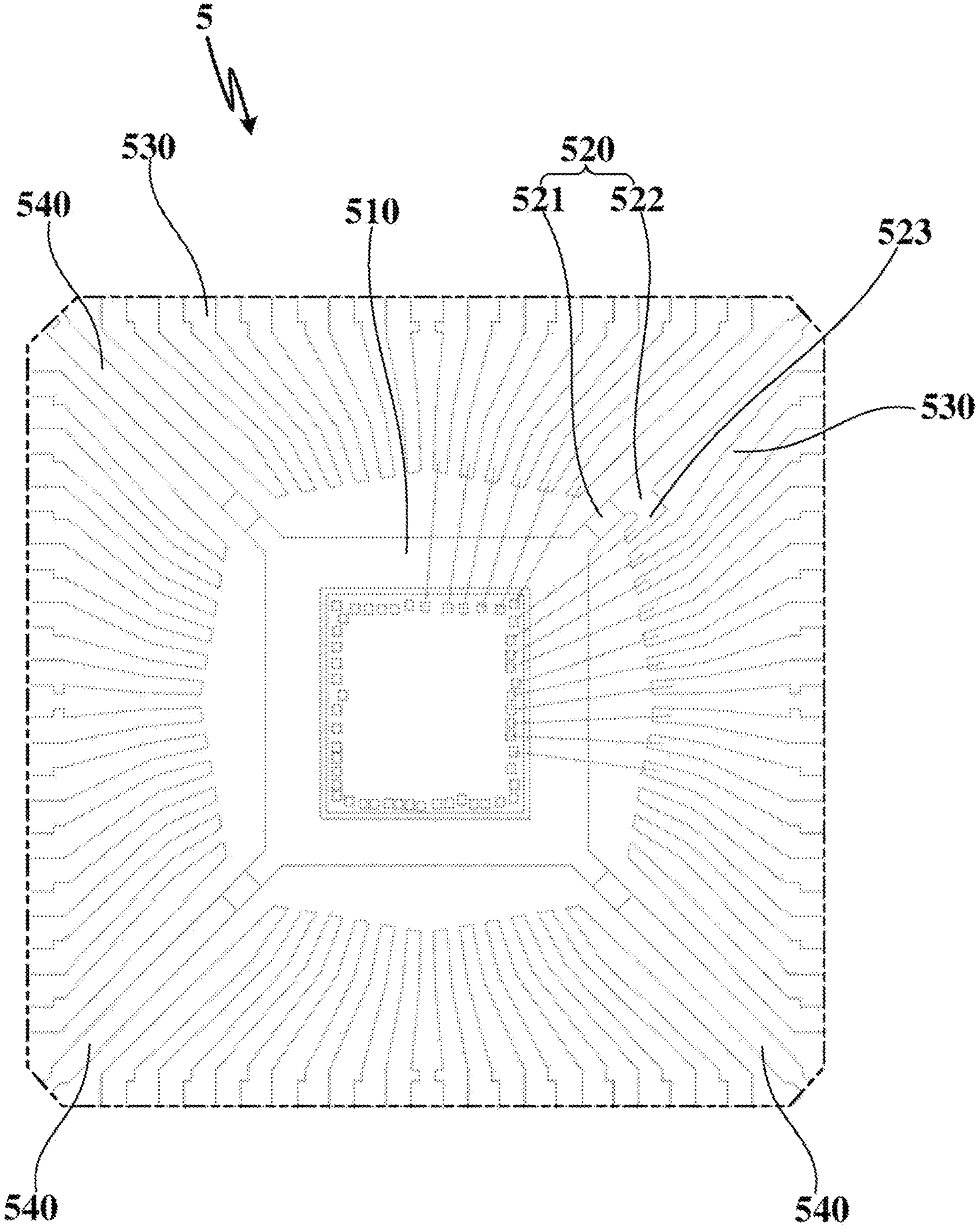
FIG. 5B is a top view showing different arrangement positions of connecting ribs in the semiconductor device 5 shown in FIG. 5A.

FIG. 5B shows different arrangement positions of the connecting rib 520 and the second connecting rib 540 in the semiconductor device 5 in this embodiment shown in FIG. 5A.

As shown in FIG. 5B, in the semiconductor device 5 in this embodiment, a connecting rib 520 and a plurality of second connecting ribs 540 may be provided, and the connecting rib 520 and the plurality of second connecting ribs 540 are disposed at four corners of the base island 510 respectively. That is, as shown in FIG. 5B, as an alternative embodiment, the first part 521 of the connecting rib 520 may be obliquely connected to one corner of the base island 510, and the branch part 523 of the connecting rib 520 is also not directly connected to the adjacent lead finger 530. And a second connecting rib 540 is disposed at the other three corners of the base island 510 respectively, such that one second connecting rib 540 is connected to one corner of the base island 510. As described above, unlike the connecting rib 520, the second connecting rib 540 is only for being connected to the base island 510 rather than for receiving a lead.

Figure 6A:
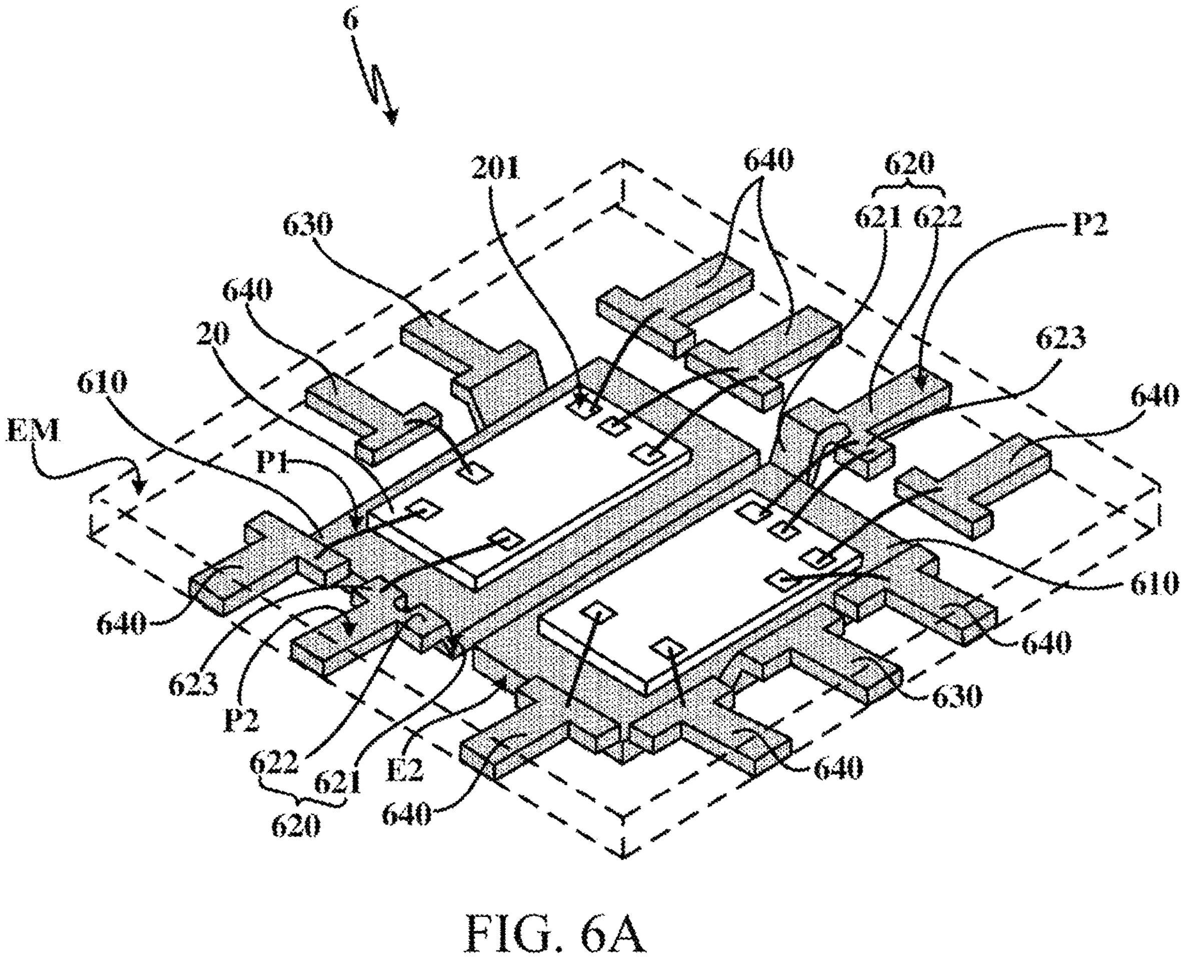
FIG. 6A is a schematic structural diagram of a semiconductor device 6 according to still a further embodiment of the present application.
Figure 6B:
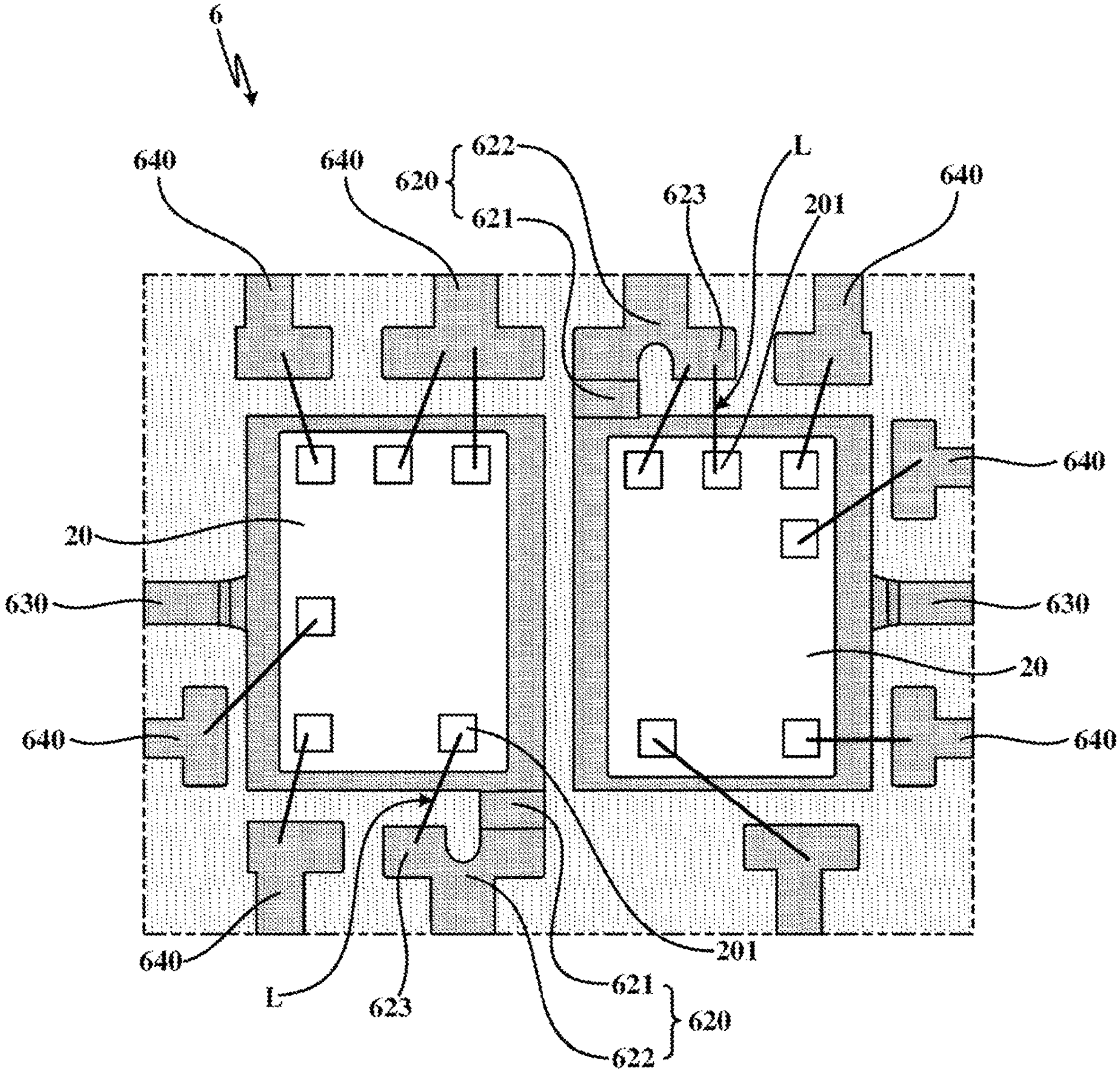
FIG. 6B is a top view of a semiconductor chip, a base island, a connecting rib, a second connecting rib, a lead finger, and a lead integrated into the semiconductor device 6 shown in FIG. 6A.

FIGS. 6A and 6B show a semiconductor device 6 constructed according to another embodiment of the present application.

As shown in FIG. 6A, the semiconductor device 6 in this embodiment includes two semiconductor chips 20, and an encapsulating material EM for plastic encapsulating the semiconductor chips 20 to form the device. Thus, as shown in FIGS. 6A and 6B, each semiconductor chip 20 corresponds to one base island.

In particular, as shown in FIGS. 6A and 6B, the semiconductor device 6 includes two chips 20, and the semiconductor device 6 is provided with two base islands 610, a connecting rib 620 disposed corresponding to each base island 610, a second connecting rib 630 provided corresponding to each base island 610, and a plurality of lead finger 640 disposed around the base island 610. Each of the chips 20 has a plurality of pads 201, and each pad 201 is electrically connected to a lead finger 640 by a lead L.

Similar to the connecting rib 120 in the semiconductor device 1 shown in FIGS. 1A-1C, as shown in FIGS. 6A and 6B, each connecting rib 620 has a first part 621 and a second part 622; where the first part 621 is a part of the connecting rib 620 that is obliquely connected to one base island 610, and a surface of the second part 622 (i.e., an upper surface of the second part 622 in FIG. 6A) is located in the second plane P2.

Similar to the connecting rib 120 in the semiconductor device 1 shown in FIGS. 1A-1C, as shown in FIGS. 6A and 6B, a branch part 623 is divided from the second part 622 of one connecting rib 620 and used for receiving a lead L connected to the pad 201 of one chip 20. In particular, the lead L is connected to a surface of the branch part 623 (i.e., an upper surface of the branch part 623 in FIG. 6A), and the surface is located in the second plane P2 as shown in FIG. 6A.

In this embodiment, as shown in FIGS. 6A and 6B, each base island 610 is correspondingly provided with one second connecting rib 640, and the second connecting rib 640 is connected to one base island 610. Unlike the connecting rib 520, the second connecting rib 640 is only for being connected to one base island 610 rather than for receiving a lead.

It will be appreciated by those skilled in the art that the present application also provides a lead frame, and after the lead frame is cut, the structures of the base island, the connecting rib, the second connecting rib, the third connecting rib, the fourth connecting rib and the lead fingers, as shown in any one of FIGS. 1A-6B, may be obtained. That is, the semiconductor device 1, the semiconductor device 2, the semiconductor device 3, the semiconductor device 4, the semiconductor device 5 and the semiconductor device 6 described above in the present application may correspond to at least one lead frame respectively, to ultimately obtain the arrangement positions and structures of the base island, the connecting rib, the second connecting rib, the third connecting rib, the fourth connecting rib and the lead fingers as shown in any one of FIGS. 1A-6B.

Figure 7A:
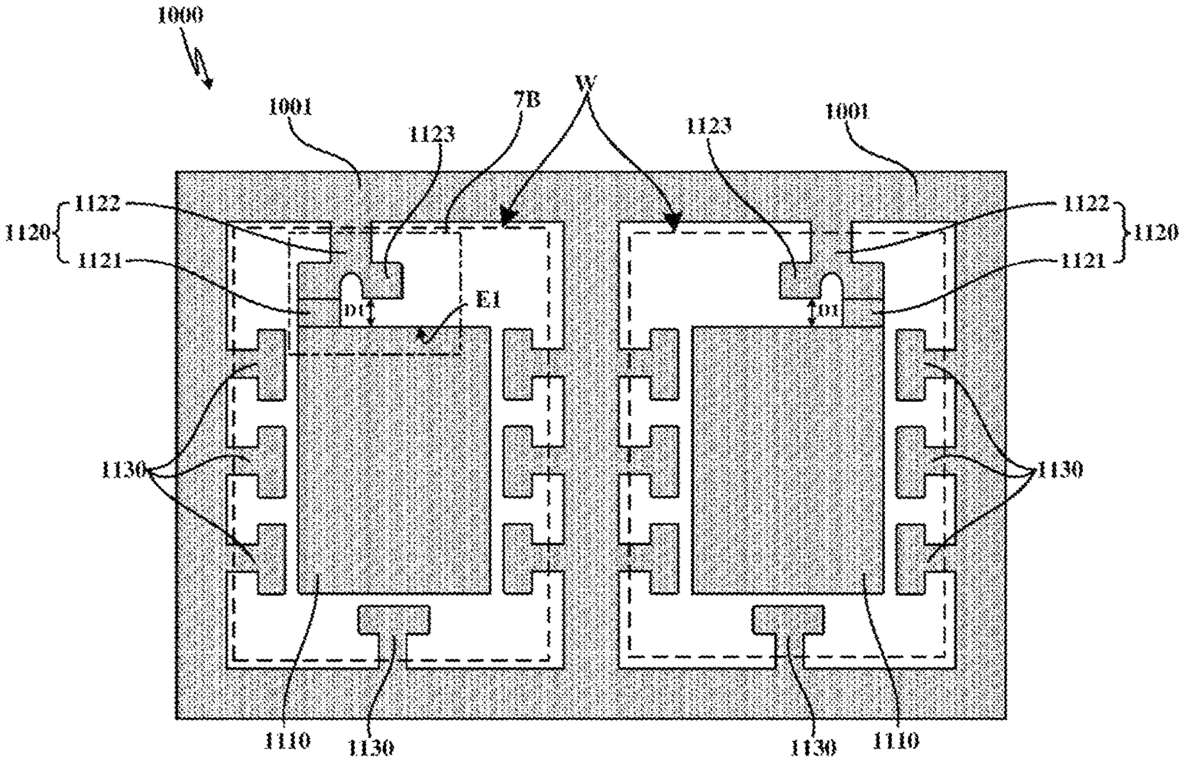
FIG. 7A is a schematic structural diagram of a lead frame 1000 according to an embodiment of the present application.

As a specific embodiment, as shown in FIG. 7A, the present application provides a lead frame 1000, and the lead frame 1000 includes at least one frame unit defined by taking a cut line W as a boundary, and each frame unit may be used to construct a package body (semiconductor device) after cutting. The structure of one frame unit is illustrated as an example below.

As shown in FIG. 7A, in one frame unit, the lead frame 1000 includes: a base island 1110, a connecting rib 1120 connected to the base island 1110, a plurality of lead fingers 1130 disposed around the base island 1110, and an outer frame 1001 for connecting the base island 1110, the connecting rib 1120 and the plurality of lead fingers 1130. It will be appreciated by those skilled in the art that the base island 1110 is used for attaching a chip thereto. The chip may further be electrically connected to the connecting rib 1120 and the lead fingers 1130 by leads.

As shown in FIG. 7A, the connecting rib 1120 has a first part 1121 and a second part 1122, and a branch part 123 is divided from the second part 122 and used for receiving a lead connected to a chip.

Figure 7B:
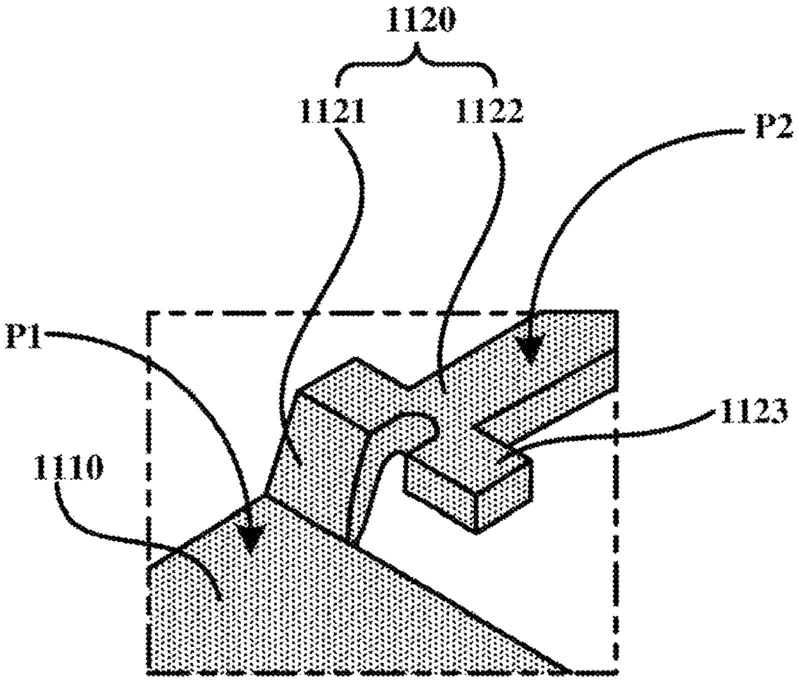
FIG. 7B is an enlarged partial view of an area 7B in FIG. 7A.

As shown in FIGS. 7A and 7B, the first part 1121 is a part of the connecting rib 1120 that is obliquely connected to the base island 110. Thus, as shown in FIG. 7B, a plane at which a surface of the base island 1110 for attaching a semiconductor chip thereto (i.e., an upper surface of the base island 1110 in FIG. 7B) is located is defined as a first plane P1; and a plane at which a surface of the second part 1122 of the connecting rib 1120 is located is a second plane P2. As shown in FIG. 7B, the second plane P2 is parallel to the first plane P1, and the second plane P2 is a plane different from the first plane P1.

As shown in FIG. 7B, a surface of the branch part 1123 for receiving a lead (i.e., an upper surface of the branch part 1123 in FIG. 7B) is located in the second plane P2. Moreover, as shown in FIG. 7A, an edge of the branch part 1123 is distant from a first edge E1 of the base island 1110 by a first distance D1.

Figure 8A:
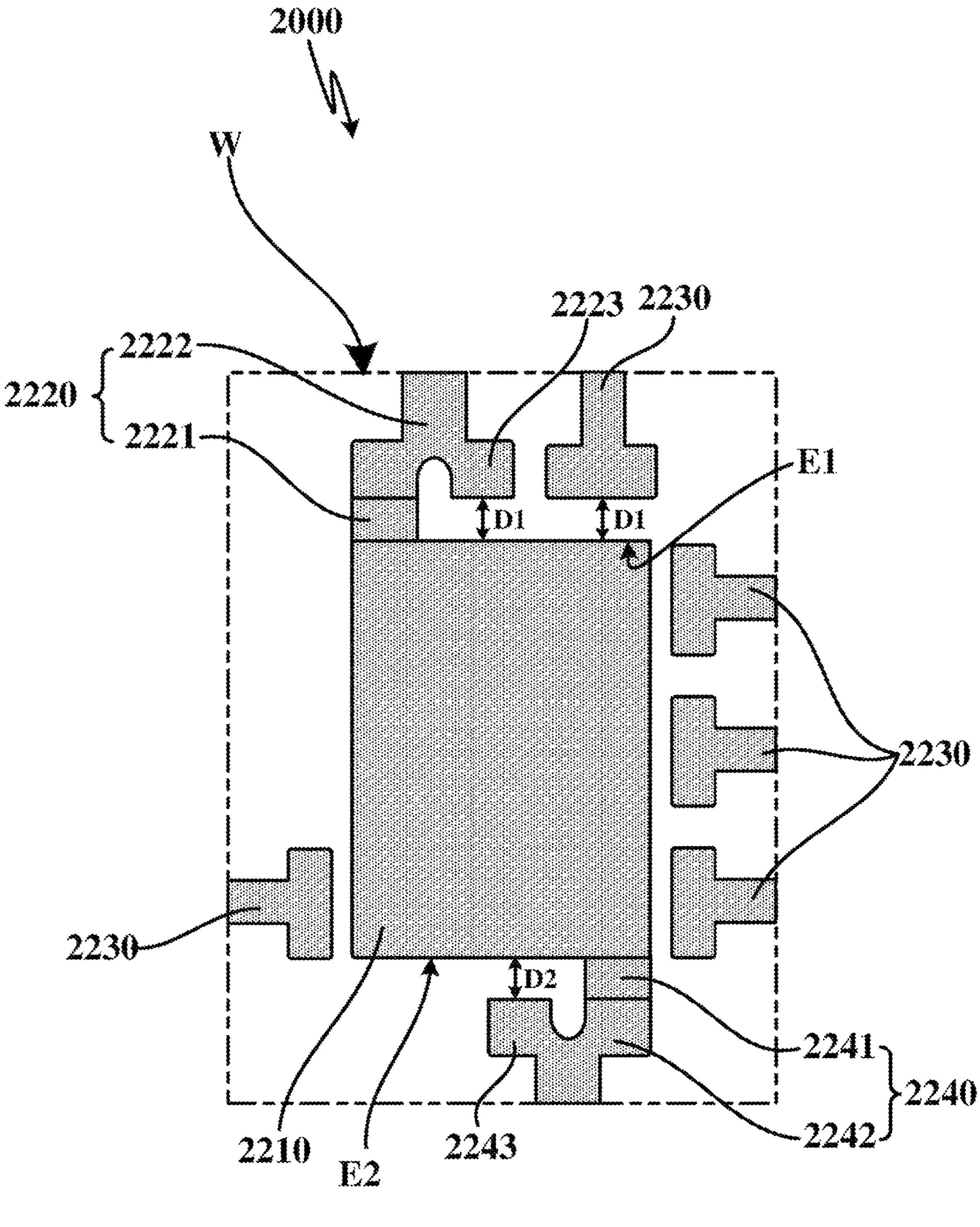
FIG. 8A is a schematic structural diagram of a frame unit of a lead frame 2000 according to an embodiment of the present application.
Figure 8B:
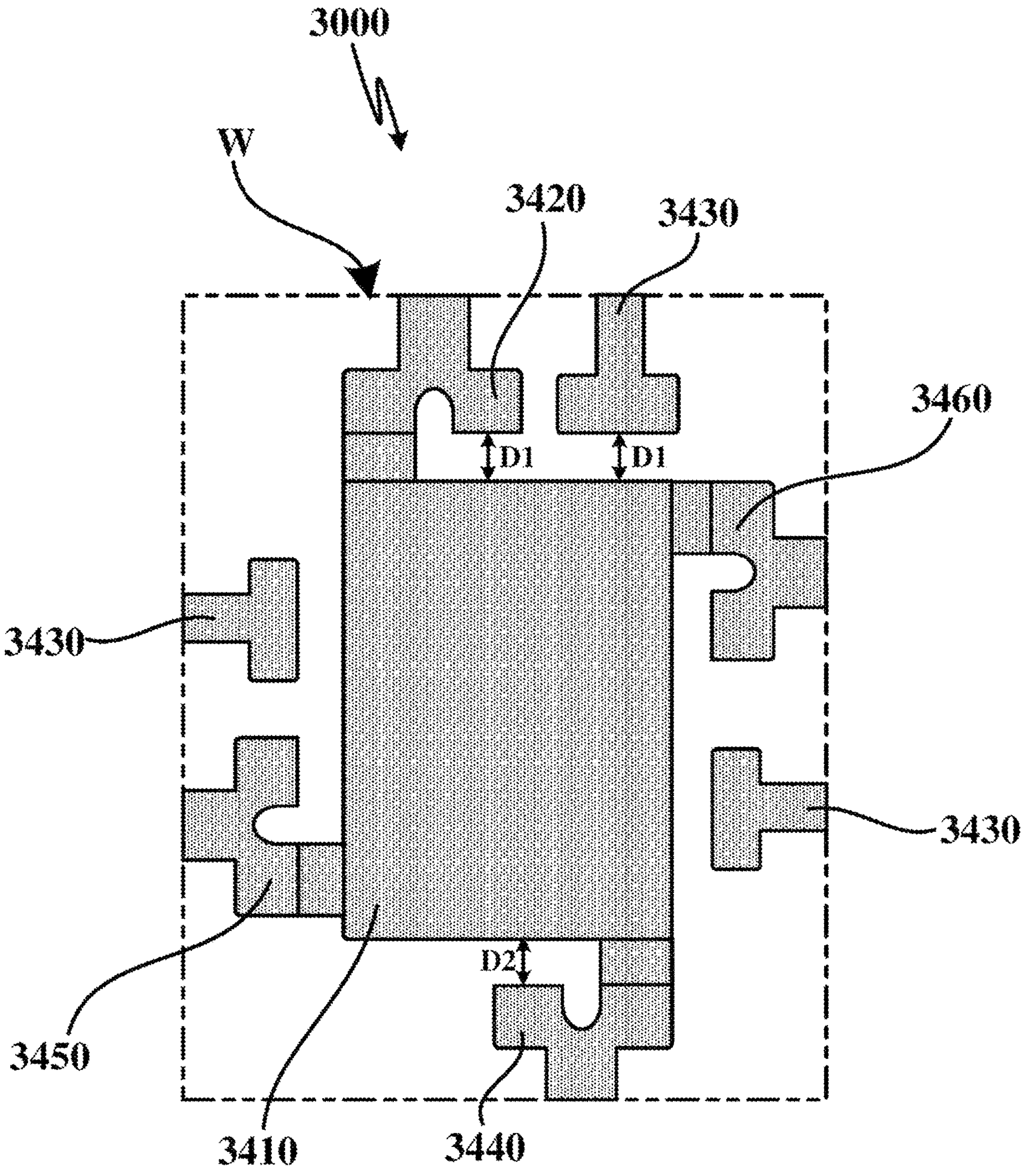
FIG. 8B is a schematic structural diagram of a frame unit of a lead frame 3000 according to another embodiment of the present application.
Figure 8C:
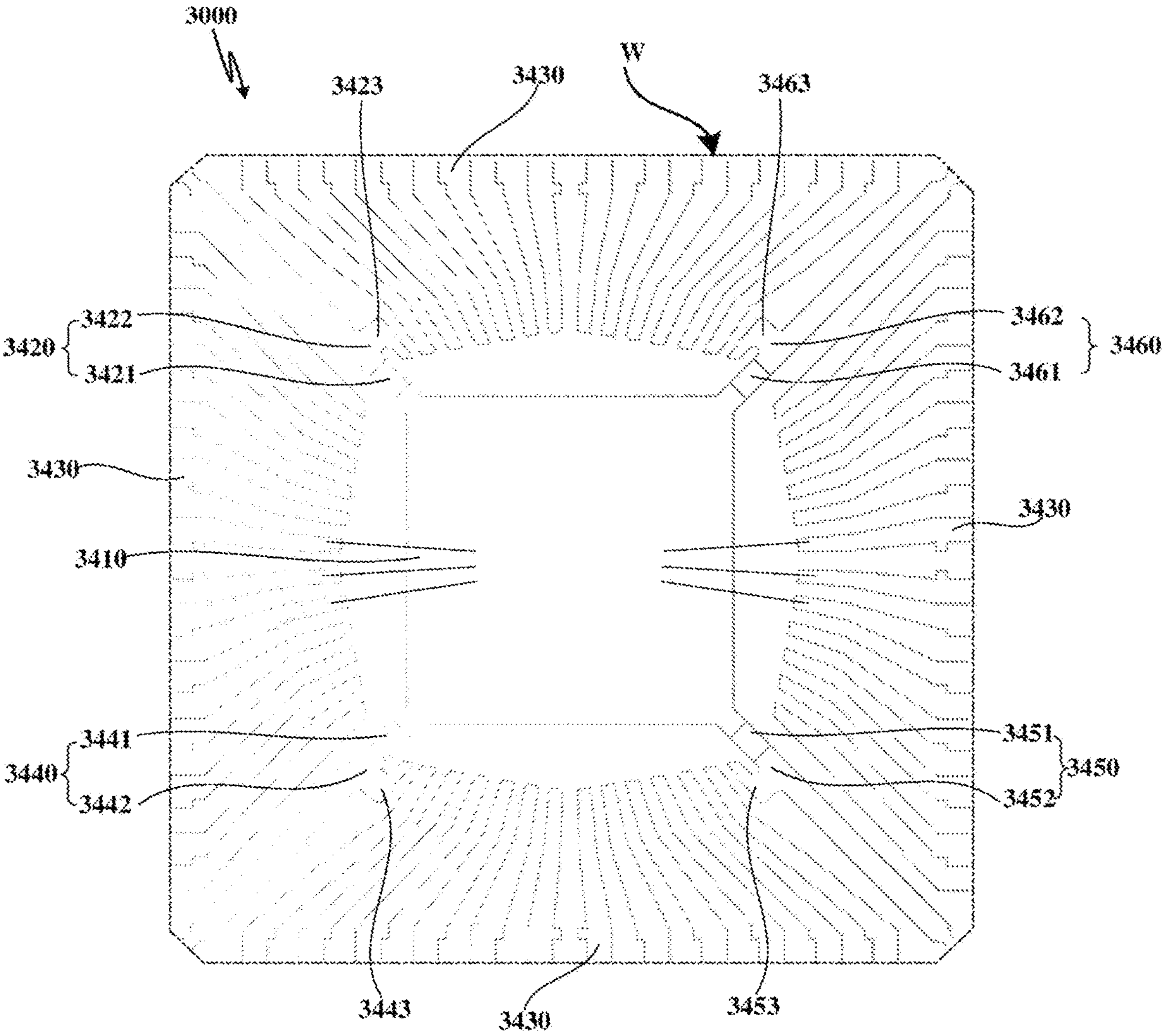
FIG. 8C is a schematic structural diagram showing different arrangement positions of the frame unit shown in FIG. 8B.

FIGS. 8A-8C show other alternative structures of the lead frame in the present application. In FIGS. 8A-8C, a frame unit defined by a cut line W is used as an example for description.

As shown in FIG. 8A, in a frame unit of a lead frame 2000 provided in another embodiment of the present application, a base island 2210, a connecting rib 2220 connected to the base island 2210 and a plurality of lead fingers 2230 disposed around the base island 2210 are included.

In this embodiment, the structural arrangements of the base island 2210, the connecting rib 2220 and the lead fingers 2230 are all the same as those in the lead frame 1000 described in FIGS. 7A and 7B. In particular, as shown in FIG. 8A, the connecting rib 2220 has a first part 2221 and a second part 2222; where the first part 2221 is a part of the connecting rib 2220 that is obliquely connected to the base island 2210. A branch part 2223 is divided from the second part 2222 of the connecting rib 2220 and used for receiving a lead connected to a chip. The surface positions of the base island 2210, the second part 2221 and the branch part 2223 are the same as those in the lead frame 1000 in FIG. 7B, and will not be described again herein.

Unlike the frame 1000, in the lead frame 2000, a second connecting rib 2240 is provided at a second edge E2 opposite to the first edge E1 of the base island 2210, and the second connecting rib 2240 also has a first part 2241 obliquely connected to the base island 2210, a second part 2242, and a branch part 2243 divided from the second part 2242, as shown in FIG. 8A. Further, an edge of the branch part 2223 of the connecting rib 2220 is distant from the first edge E1 of the base island 2210 by a first distance D1, and the branch part 2242 of the second connecting rib 2240 is distant from the second edge E2 of the base island 2210 by a second distance D2. The second distance D2 is equal to the first distance D1, and may also be set specifically according to actual process requirements.

As shown in FIG. 8B, in a frame unit of a lead frame 3000 provided in another embodiment of the present application, a base island 3410, a connecting rib 3420 connected to the base island 3410, a plurality of lead fingers 3430 disposed around the base island 3410, a second connecting rib 3440, a third connecting rib 3450 and a fourth connecting rib 3460 are included. The structures of the third connecting rib 3450 and the fourth connecting rib 3460 are the same as the structure of the connecting rib 2220 in FIGS. 7A and 7B.

FIG. 8C shows another position arrangement of the connecting rib 3420, the second connecting rib 3440, the third connecting rib 3450 and the fourth connecting rib 3460 of the lead frame 3000 shown in FIG. 8B. As shown in FIG. 8C, the connecting rib 3420, the second connecting rib 3440, the third connecting rib 3450 and the fourth connecting rib 3460 are disposed at four corners of the base island 3410 respectively.

As shown in FIG. 8C, in the lead frame 3000 in this embodiment, the connecting rib 3420, the second connecting rib 3440, the third connecting rib 3450 and the fourth connecting rib 3460 may be disposed at the four corners of the base island 3410 respectively. That is, as shown in FIG. 8C, as an alternative embodiment, the first part 3421 of the connecting rib 3420, the first part 3441 of the second connecting rib 3440, the first part 3451 of the third connecting rib 3450 and the first part 3461 of the fourth connecting rib 3460 may be obliquely connected to the four corners of the base island 3410 respectively. Meanwhile, the branch part 3423 of the connecting rib 3420, the branch part 3453 of the third connecting rib 3450 and the branch part 3463 of the fourth connecting rib 3460 are not directly connected to the adjacent lead fingers 3430 respectively. Further, as shown in FIG. 8C, the edges, facing the base island 3410, of the branch part 3443 of the second connecting rib 3440, the branch part 3453 of the third connecting rib 3450 and the fourth connecting rib 3463 are also respectively collinear with the edges of the adjacent lead fingers 3430.

In the present application, the branch part is divided from the second part of the connecting rib (and/or the second connecting rib and/or the third connecting rib and/or the fourth connecting rib) so as to distinguish an area for lead bonding in the connecting rib, and the other second parts, as well as the first part obliquely connected to the base island, of the connecting rib mainly play a role of connection to the base island in the lead frame as played by conventional connecting ribs. Therefore, in a subsequent lead bonding process, when a lead finger is flattened by rolling before being subjected to regular wire bonding, since the surface of the second part of the connecting rib, the surface of the branch part and the surface of the lead finger are all in a same plane (second plane), the second part and the branch part of the connecting rib are also flattened by rolling to have a surface quality allowing lead bonding. Thus, quality problems caused in existing lead frames by indentations and/or unevenness and the like of connecting ribs when leads are welded on the connecting ribs are solved.

Further, since the surface of the second part of the connecting rib and the surfaces of the other lead fingers are located in a same plane, it is also avoided that the solder joint position of the lead is low, thereby solving the problem that the wire radian and the wire length are not ideal and the problem of wire off due to the easy delamination of the base island surface and an encapsulating material.

The present application has been described by the above-mentioned related embodiments; however, the above-mentioned embodiments are merely examples for implementing the present application. It should be noted that the disclosed embodiments do not limit the scope of the present application. Instead, all modifications and equivalents contained in

What is claimed is:

1. A semiconductor device comprising:

at least one semiconductor chip attached to a surface of a base island in a first plane, wherein a connecting rib is connected to the base island and the at least one semiconductor chip has a first part obliquely connected to the base island;

wherein the connecting rib has a second part having a surface in a second plane parallel to the first plane and in a plane different from the first plane;

wherein the connecting rib has a branch part divided from the second part, wherein the branch part has, in the second plane, a surface used for receiving a lead connected to the semiconductor chip, wherein the branch part has an edge that is distant from a first edge of the base island by a first distance;

wherein the semiconductor device further comprises a second connecting rib, a third connecting rib, and a fourth connecting rib that are connected to the base island at four corners of the base island;

wherein the semiconductor device further comprises a plurality of lead fingers, each lead finger has a surface in the second plane, the surface of each lead finger is used for receiving a lead connected to the semiconductor chip; and wherein each lead finger has an edge which is distant from the first edge of the base island by the first distance.

2. The semiconductor device according to claim 1, wherein the semiconductor device further comprises a lead connecting the semiconductor chip to the branch part of the connecting rib.

3. The semiconductor device according to claim 2, wherein the semiconductor device further comprises a lead connecting the semiconductor chip to each lead finger.

4. The semiconductor device according to claim 1, wherein the semiconductor device further comprises a second connecting rib connected to the base island at an opposite side of the base island.

5. The semiconductor device according to claim 4, wherein the second connecting rib has a branch part divided from the second connecting rib, the branch part has, in the second plane, a surface used for receiving a lead connected to the semiconductor chip, and the branch part of the second connecting rib has an edge which is distant from a second edge of the base island by a second distance.

6. The semiconductor device according to claim 1, wherein the second connecting rib, the third connecting rib and the fourth connecting rib each have a branch part divided from a corresponding connecting rib, and the branch parts each have, in the second plane, a surface used for receiving a lead connected to the semiconductor chip.

7. The semiconductor device according to claim 6, wherein the semiconductor device further comprises a lead finger adjacent to the branch part, and the lead finger and the adjacent branch part have collinear edges facing an edge of the base island.

8. A lead frame for a semiconductor device comprising:

at least one base island that has, in a first plane, a surface used for receiving a semiconductor chip;

a connecting rib that is connected to the base island and has a first part obliquely connected to the at least one base island, the connecting rib having a second part, the second part having a surface in a second plane, and the second plane being parallel to the first plane and being a plane different from the first plane;

a second connecting rib, a third connecting rib, and a fourth connecting rib that are connected to the base island at four corners of the at least one base island; and a plurality of lead fingers adjacent to the connecting rib;

wherein the connecting rib has a branch part divided from the second part, the branch part has, in the second plane, a surface used for receiving a lead connected to the semiconductor chip, and the branch part is not directly connected to the adjacent lead finger;

wherein the branch part has an edge which is distant from a first edge of the base island by a first distance; and wherein each lead finger has a surface in the second plane, the surface of each lead finger is used for receiving a lead connected to the semiconductor chip, and each lead finger has an edge which is distant from the first edge of the base island by the first distance.

9. The lead frame according to claim 8, wherein the semiconductor device further comprises a second connecting rib connected to the at least one base island at an opposite side of the at least one base island.

10. The lead frame according to claim 9, wherein the second connecting rib has a branch part divided from the second connecting rib, the branch part has, in the second plane, a surface used for receiving a lead connected to the semiconductor chip, and the branch part of the second connecting rib is not directly connected to the adjacent lead finger.

11. The lead frame according to claim 8, wherein the second connecting rib, the third connecting rib and the fourth connecting rib each have a branch part divided from a corresponding connecting rib, the branch parts each have, in the second plane, a surface used for receiving a lead connected to the semiconductor chip, and the branch part of the second connecting rib, the branch part of the third connecting rib and the branch part of the fourth connecting rib are each not directly connected to the adjacent lead finger.

12. The lead frame according to claim 11, wherein the branch part of the second connecting rib, the branch part of the third connecting rib and the branch part of the fourth connecting rib respectively have an edge which is distant from a second edge of the base island by a second distance.

13. A method for forming a semiconductor package, the method comprising:

providing a lead frame comprising:

at least one base island that has, in a first plane, a surface used for receiving a semiconductor chip;

a connecting rib that is connected to the at least one base island and has a first part obliquely connected to the at least one base island, the connecting rib having a second part, the second part having a surface in a second plane, and the second plane being parallel to the first plane and being a plane different from the first plane;

a second connecting rib, a third connecting rib, and a fourth connecting rib that are connected to the at least one base island at four corners of the at least one base island, wherein the second connecting rib, the third connecting rib, and the fourth connecting rib each have a branch part divided from a corresponding connecting rib, and the branch parts each have, in the second plane, a surface used for receiving a lead connected to the semiconductor chip; and a plurality of lead fingers adjacent to the connecting rib;

wherein the connecting rib has a branch part divided from the second part, the branch part has, in the second plane, a surface used for receiving a lead connected to the semiconductor chip, and the branch part is not directly connected to the adjacent lead finger;

wherein the branch part has an edge which is distant from a first edge of the base island by a first distance; and wherein each lead finger has a surface in the second plane, the surface of each lead finger is used for receiving a lead connected to the semiconductor chip, and each lead finger has an edge which is distant from the first edge of the base island by the first distance;

attaching a semiconductor chip to the base island of the lead frame;

forming wire bonds between pads on the semiconductor chip and the lead fingers; and forming an encapsulating material over the semiconductor chip and the lead frame.

14. The method of claim 13, wherein method further comprises a second connecting rib connected to the base island at an opposite side of the base island.

15. The method of claim 14, wherein the second connecting rib has a branch part divided from the second connecting rib, the branch part has, in the second plane, a surface used for receiving a lead connected to the semiconductor chip, and the branch part of the second connecting rib is not directly connected to the adjacent lead finger.

* * * * *